(12) United States Patent
Kang et al.

(10) Patent No.: US 11,594,171 B2
(45) Date of Patent: Feb. 28, 2023

(54) DISPLAY DEVICE AND METHOD FOR MANUFACTURING SAME

(71) Applicant: Samsung Display Co., Ltd., Yongin-si (KR)

(72) Inventors: Sin Chul Kang, Hwaseong-si (KR); Won Sik Oh, Hwaseong-si (KR); Yo Han Lee, Hwaseong-si (KR); Hee Keun Lee, Hwaseong-si (KR); Hyun Min Cho, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/277,264

(22) PCT Filed: Jul. 8, 2019

(86) PCT No.: PCT/KR2019/008350
§ 371 (c)(1),
(2) Date: Mar. 17, 2021

(87) PCT Pub. No.: WO2020/060015
PCT Pub. Date: Mar. 26, 2020

(65) Prior Publication Data
US 2021/0358393 A1 Nov. 18, 2021

(30) Foreign Application Priority Data

Sep. 18, 2018 (KR) .................. 10-2018-0111827

(51) Int. Cl.
*G09G 3/32* (2016.01)
*H01L 25/075* (2006.01)
(Continued)

(52) U.S. Cl.
CPC ........... *G09G 3/32* (2013.01); *H01L 25/0753* (2013.01); *H01L 33/005* (2013.01); *H01L 33/62* (2013.01);
(Continued)

(58) Field of Classification Search
CPC ............. G09G 3/32; G09G 2300/0413; G09G 2310/0267; G09G 2330/028;
(Continued)

(56) References Cited

U.S. PATENT DOCUMENTS 10,818,647 B2   10/2020   Kim et al.
11,462,526 B2   10/2022   Kim et al.
(Continued)

FOREIGN PATENT DOCUMENTS

KR   10-2010-0057410 A   5/2010
KR   10-2011-0041401 A   4/2011
(Continued)

OTHER PUBLICATIONS

International Search Report for corresponding Application No. PCT/KR2019/008350 dated Oct. 29, 2019, 4 pp.
(Continued)

*Primary Examiner* — Ibrahim A Khan
(74) *Attorney, Agent, or Firm* — Lewis Roca Rothgerber Christie LLP

(57) ABSTRACT

A method for manufacturing a display device including a substrate including a display area and a non-display area located outside the display area, the display area including pixel areas, is provided. First switching elements are formed in the pixel areas, respectively, and a circuit element layer that includes reference voltage wire in the non-display area and electrically connected to the first switching elements is formed. Pixel electrodes that include first pixel electrodes in the pixel areas on the circuit element layer, respectively, and (Continued)

electrically connected through the first switching elements to the reference voltage wire, and second pixel electrodes facing the first pixel electrodes, are formed. A plurality of light emitting elements are arranged between the first pixel electrodes and the second pixel electrodes. A first source voltage is applied to the reference voltage wire and a second source voltage is applied to the second pixel electrodes.

20 Claims, 35 Drawing Sheets

(51) Int. Cl.
 *H01L 33/00* (2010.01)
 *H01L 33/62* (2010.01)
(52) U.S. Cl.
 CPC .............. *G09G 2300/0413* (2013.01); *G09G 2310/0267* (2013.01); *G09G 2330/028* (2013.01); *H01L 2933/0066* (2013.01)
(58) Field of Classification Search
 CPC ... H01L 25/0753; H01L 33/005; H01L 33/62; H01L 2933/0066; H01L 27/124; H01L 27/1248; H01L 27/156; H01L 27/1214; H01L 33/36
 See application file for complete search history.

(56) References Cited

U.S. PATENT DOCUMENTS

| | | | |
|---|---|---|---|
| 2010/0127615 A1 | 5/2010 | Kim et al. | |
| 2014/0159043 A1* | 6/2014 | Sakariya | H01L 27/156 438/34 |
| 2014/0367633 A1* | 12/2014 | Bibl | H01L 27/322 257/13 |
| 2016/0148911 A1* | 5/2016 | Do | H05K 1/0295 438/28 |
| 2016/0172339 A1* | 6/2016 | Do | H01L 33/62 257/89 |
| 2016/0189585 A1 | 6/2016 | Na | |
| 2016/0189644 A1 | 6/2016 | So et al. | |
| 2016/0190166 A1* | 6/2016 | Kim | G09G 3/3233 257/71 |
| 2016/0211245 A1* | 7/2016 | Do | G02F 1/133603 |
| 2016/0260781 A1 | 9/2016 | Yang et al. | |
| 2017/0263178 A1* | 9/2017 | Bae | H01L 25/0753 |
| 2017/0338289 A1* | 11/2017 | Seo | H01L 51/5281 |
| 2017/0358563 A1* | 12/2017 | Cho | H01L 33/20 |
| 2018/0012876 A1* | 1/2018 | Kim | H01L 33/325 |
| 2018/0019426 A1* | 1/2018 | Im | H01L 25/0753 |
| 2018/0175009 A1* | 6/2018 | Kim | H01L 25/0753 |
| 2018/0175104 A1* | 6/2018 | Kang | F21K 9/68 |
| 2018/0287010 A1* | 10/2018 | Sung | H01L 33/007 |

FOREIGN PATENT DOCUMENTS

| | | |
|---|---|---|
| KR | 10-2016-0081241 A | 7/2016 |
| KR | 10-2016-0082770 A | 7/2016 |
| KR | 10-1782889 B1 | 9/2017 |
| KR | 10-2018-0009014 A | 1/2018 |
| KR | 2018-0007025 A | 1/2018 |
| KR | 10-1845907 B1 | 4/2018 |
| KR | 10-2018-0072909 A | 7/2018 |
| KR | 10-2019-0095638 A | 8/2019 |

OTHER PUBLICATIONS

Korean Office Action dated Nov. 15, 2022 regarding Korean Patent Application No. 10-2018-0111827 corresponding to U.S. Appl. No. 17/277,264 (6 pages).

* cited by examiner

DISPLAY DEVICE AND METHOD FOR MANUFACTURING SAME

CROSS-REFERENCE TO RELATED APPLICATIONS

This application is a U.S. National Phase Patent Application of International Patent Application Number PCT/KR2019/008350, filed on Jul. 8, 2019, which claims priority to Korean Patent Application No. 10-2018-0111827, filed Sep. 18, 2018, the entire contents of both of which are incorporated herein by reference.

BACKGROUND

1. Field

The present disclosure relates to a display device including light-emitting diodes and a method of fabricating the same.

2. Description of Related Arts

A display device displays a high-quality image by using light-emitting elements such as light-emitting diodes as light sources of pixels. Light-emitting diodes exhibit relatively good durability even under harsh environmental conditions, and also exhibit excellent life and luminance.

Recently, research has been conducted to fabricate micro light-emitting diodes using a material having a highly reliable inorganic crystal structure and to dispose them on a display panel, so that they can be used as next-generation light sources for pixels. As a part of such research, ultra-small light-emitting diodes in micro-scale or nano-scale are under development, which are used as light sources for each pixel of a light-emitting display device.

SUMMARY

Aspects of the present disclosure provide a method of fabricating a display device by which light-emitting elements can be aligned easily and the fabrication efficiency can be increased, and a display device fabricated by the method.

These and other aspects, embodiments, and features of the present disclosure will become immediately apparent to those of ordinary skill in the art upon review of the detailed description and claims to follow.

According to an embodiment of the present disclosure, there is provided a method of fabricating a display device including a substrate, the substrate including a display area and a non-display area located outside the display area, the display area including a plurality of pixel areas, the method including forming a first switching element in each of the pixel areas, and forming a circuit element layer in the non-display area, the circuit element layer including a reference voltage line electrically connected to the first switching element; forming pixel electrodes on the circuit element layer in the pixel areas, the pixel electrodes comprising a first pixel electrode and a second pixel electrode, the first pixel electrode being electrically connected to the reference voltage line through the first switching element and the second pixel electrode opposite the first pixel electrode; arranging a plurality of light-emitting elements between the first pixel electrode and the second pixel electrode; and aligning the light-emitting elements between the first pixel electrode and the second pixel electrode by applying a first power supply voltage to the reference voltage line and applying a second power supply voltage to the second pixel electrode.

The method may further include: forming first contact electrodes on first ends of the light-emitting elements to connect the light-emitting elements with the first pixel electrode; and forming second contact electrodes on second ends of the light-emitting elements to connect the light-emitting elements with the second pixel electrode.

No etching process may be carried out between the aligning the light-emitting elements and the forming the first contact electrodes.

The aligning the light-emitting elements may include applying a first control signal for turning on the first switching element to a control electrode of the first switching element.

The circuit element layer may further include a second switching element connected between the first pixel electrode and a first power supply voltage terminal, and a third switching element connected between a control electrode of the second switching element and a data line.

The aligning the light-emitting elements may further include: turning on each of the second switching element and the third switching element, a turn-on voltage for turning on the second switching element is applied to the data line, and the first power supply voltage is applied to the first voltage terminal.

The circuit element layer may further include a capacitor connected between the first pixel electrode and the control electrode of the second switching element.

The aligning the light-emitting elements may further include turning on the third switching element, and wherein the first power supply voltage is applied to the data line.

The forming the pixel electrodes may further include: forming a first line connected to the reference voltage line in the non-display area, and a connection electrode connecting the first line with the first pixel electrode.

The first power supply voltage may be applied to the reference voltage line through the first line.

The method may further include removing the connection electrode to separate the first line from the first pixel electrode.

The circuit element layer may further include a first insulating layer, a second insulating layer, a third insulating layer and a fourth insulating layer sequentially stacked on one another between the substrate and a display element layer.

The reference voltage line may include at least one of: a first sub-line between the third insulating layer and the fourth insulating layer; a second sub-line between the second insulating layer and the third insulating layer; a third sub-line between the first insulating layer and the second insulating layer; and a fourth sub-line between the substrate and the first insulating layer.

A first voltage line may include a first sub-voltage line on the circuit element layer and directly connected to the reference voltage line, and a second sub-voltage line on the first sub-voltage line, and a conductivity of the second sub-voltage line may be greater than that of the first sub-voltage line.

The forming the circuit element layer may include: forming a scan signal line connected to a control electrode of the first switching element, and a first dummy switching element connecting the scan signal line with a dummy line in the non-display area.

The aligning the light-emitting diodes may include: applying a turn-on voltage for turning on the first switching element to the dummy line; and turning on the first dummy switching element.

The circuit element layer may further include a second dummy switching element connecting the scan signal line with an adjacent scan signal line, and wherein the aligning the light-emitting elements further comprises turning on the second dummy switching element.

According to another aspect of the present disclosure, there is provided a display device including a substrate including a display area and a non-display area located outside the display area, the display area including a plurality of pixel areas. A circuit element layer including a first switching element in each of the pixel areas, a reference voltage line in the non-display area and electrically connected to the first switching element, and a scan line connected to a control electrode of the first switching element. A display element layer including a first pixel electrode on the circuit element layer in each of the pixel areas and electrically connected to the reference voltage line through the first switching element, a second pixel electrode opposite the first pixel electrode, and a plurality of light-emitting elements arranged between the first pixel electrode and the second pixel electrode. The circuit element layer further includes a dummy line in the non-display area, and a first dummy switching element connected between the dummy line and the scan line.

The circuit element layer may further include a second dummy switching element connecting the scan signal line with an adjacent scan line.

According to yet another aspect of the present disclosure, there is provided a display device including a substrate including a display area and a non-display area located outside the display area, the display area including a plurality of pixel areas. A circuit element layer including a circuit element in each of the pixel areas, and a reference voltage line in the non-display area and electrically connected to the circuit element. A display element layer includes a first pixel electrode on the circuit element layer in each of the pixel areas, a second pixel electrode opposite the first pixel electrode, and a plurality of light-emitting elements arranged between the first pixel electrode and the second pixel electrode. The second pixel electrode is around the first pixel electrode.

The details of one or more embodiments of the subject matter described in this disclosure are set forth in the accompanying drawings and the description below.

According to embodiments of the present disclosure, an alignment voltage is applied through a reference voltage line connected to a pixel electrode in a display device, so that a process of forming an additional alignment line can be omitted. As a result, the efficiency of fabricating the display device can be improved.

It should be noted that aspects of the embodiments of the present disclosure are not limited to those described above and other aspects of the embodiments of the present disclosure will be apparent to those skilled in the art from the following descriptions.

DETAILED DESCRIPTION

Figure 1:
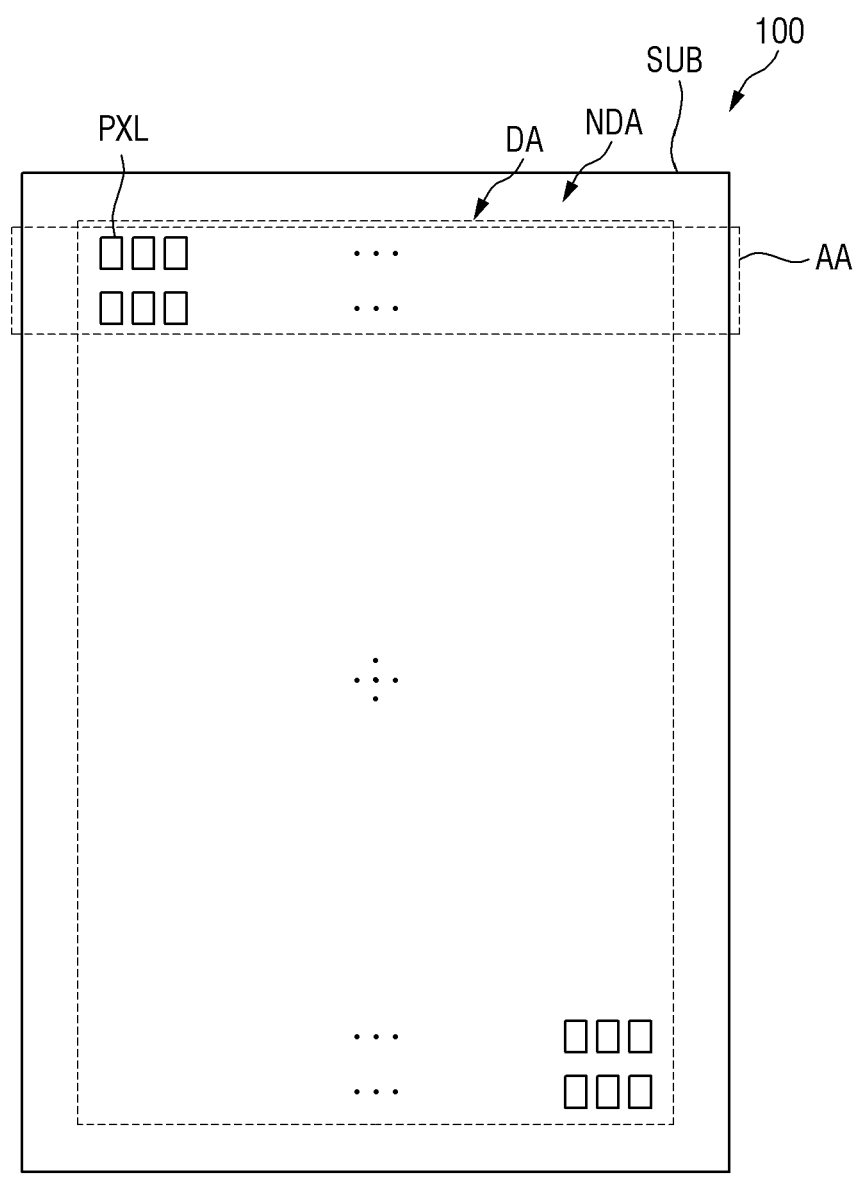
FIG. 1 is a plan view schematically showing a display device according to an embodiment of the present disclosure.

Aspects and features of the present disclosure and methods to achieve them will become apparent from the descriptions of embodiments hereinbelow with reference to the accompanying drawings. However, the present disclosure is not limited to embodiments disclosed herein but may be implemented in various different ways. The embodiments are provided for making the disclosure of the present disclosure thorough and for fully conveying the scope of the present disclosure to those skilled in the art. It is to be noted that the scope of the present disclosure is defined only by the claims.

As used herein, a phrase "an element A on an element B" refers to that the element A may be disposed directly on the element B and/or the element A may be disposed indirectly on the element B via another element C. Like reference numerals denote like elements throughout the descriptions.

Although terms such as first, second, etc. are used to distinguish arbitrarily between the elements such terms describe, and thus these terms are not necessarily intended to indicate temporal or other prioritization of such elements. These terms are used to merely distinguish one element from another. Accordingly, as used herein, a first element may be a second element within the technical scope of the present disclosure.

Hereinafter, embodiments of the present disclosure will be described with reference to the accompanying drawings.

FIG. 1 is a plan view schematically showing a display device according to an embodiment of the present disclosure.

Referring to FIG. 1, a display device 100 may include a substrate SUB and pixels PXL disposed on the substrate SUB.

The substrate SUB (or the display device 100) may include a display area DA and a non-display area NDA. In the display area DA, images can be displayed. In the non-display area NDA, images may not be displayed. The display area DA may be disposed at the central area of the display device 100, while the non-display area NDA may be disposed outside the display area DA to surround the display area DA or may be disposed at the edges of the display device 100. For example, the non-display area NDA may surround the display area along the edge or periphery of the display area DA. It is, however, to be understood that the present disclosure is not limited thereto. For example, the non-display area NDA may be disposed only on one side of the display area DA.

The substrate SUB may be either a rigid substrate or a flexible substrate, and its material or physical properties are not particularly limited herein. For example, the substrate SUB may be a rigid substrate made of glass or tempered glass, or a flexible substrate implemented as a thin film made of plastic or metal.

The pixels PXL may be disposed in the display area DA on the substrate SUB. The substrate SUB (or the display area DA) may include a plurality of pixel areas, and the pixels PXL may be formed in the pixel areas, respectively. In the non-display area NDA, lines connected to the pixels PXL in the display area DA and/or circuitry embedded therein may be disposed.

The pixels PXL may include circuit elements and a plurality of light-emitting diodes LD. The circuit elements may transmit current (or driving current) to the light-emitting diodes LD in response to a scan signal and a data signal provided externally, and the light-emitting diodes LD may emit light with a luminance proportional to the magnitude of the current. The light-emitting diodes LD may have a size in micro-scale or nano-scale, may have a rod-like shape or a bar-like shape, and may be connected in parallel to one another. The configuration of the light-emitting diodes LD will be described in detail later with reference to FIG. 10.

Figure 2:
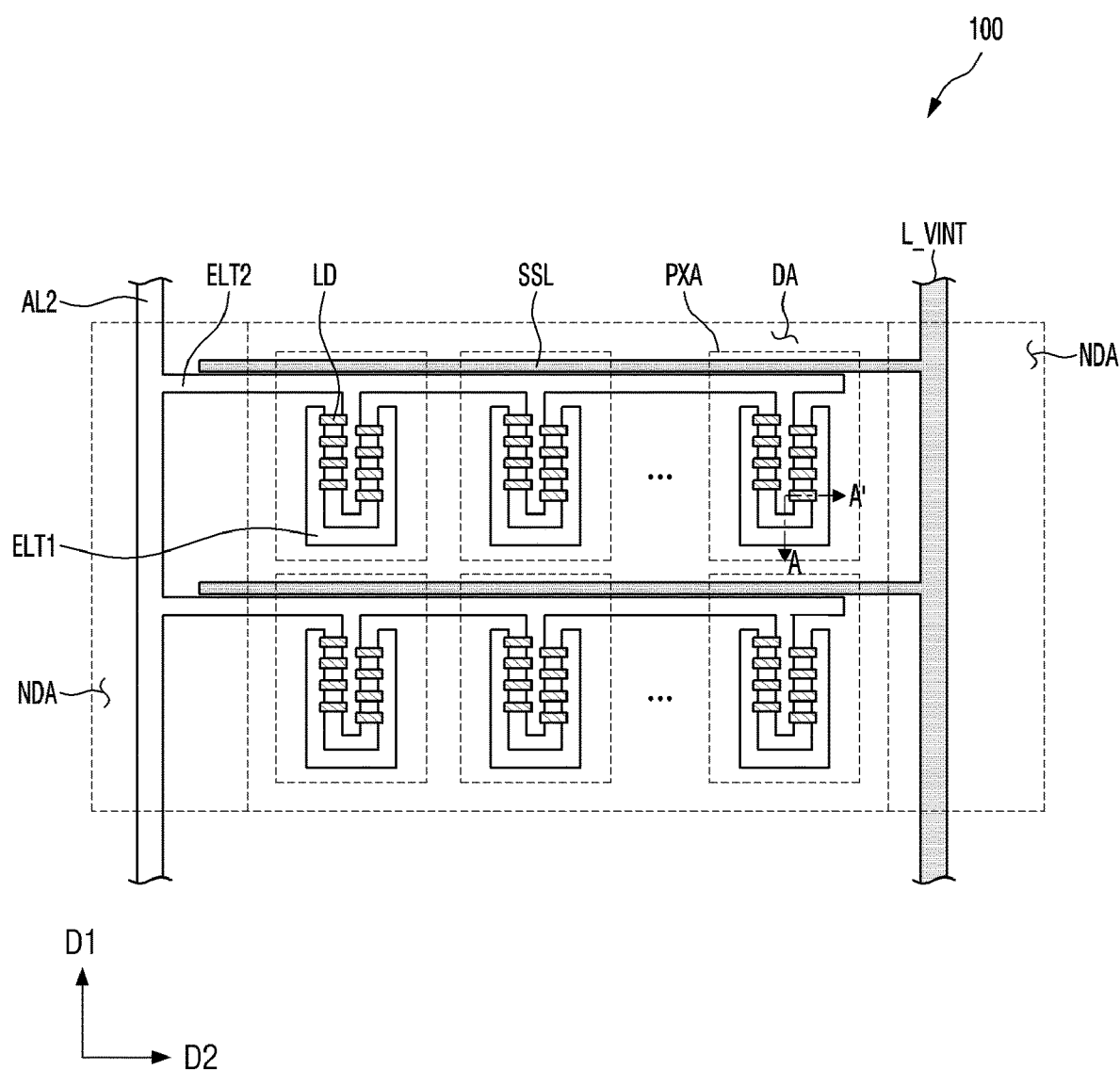
FIGS. 2 and 3 are plan views of display devices according to some embodiments of the present disclosure.
Figure 3:
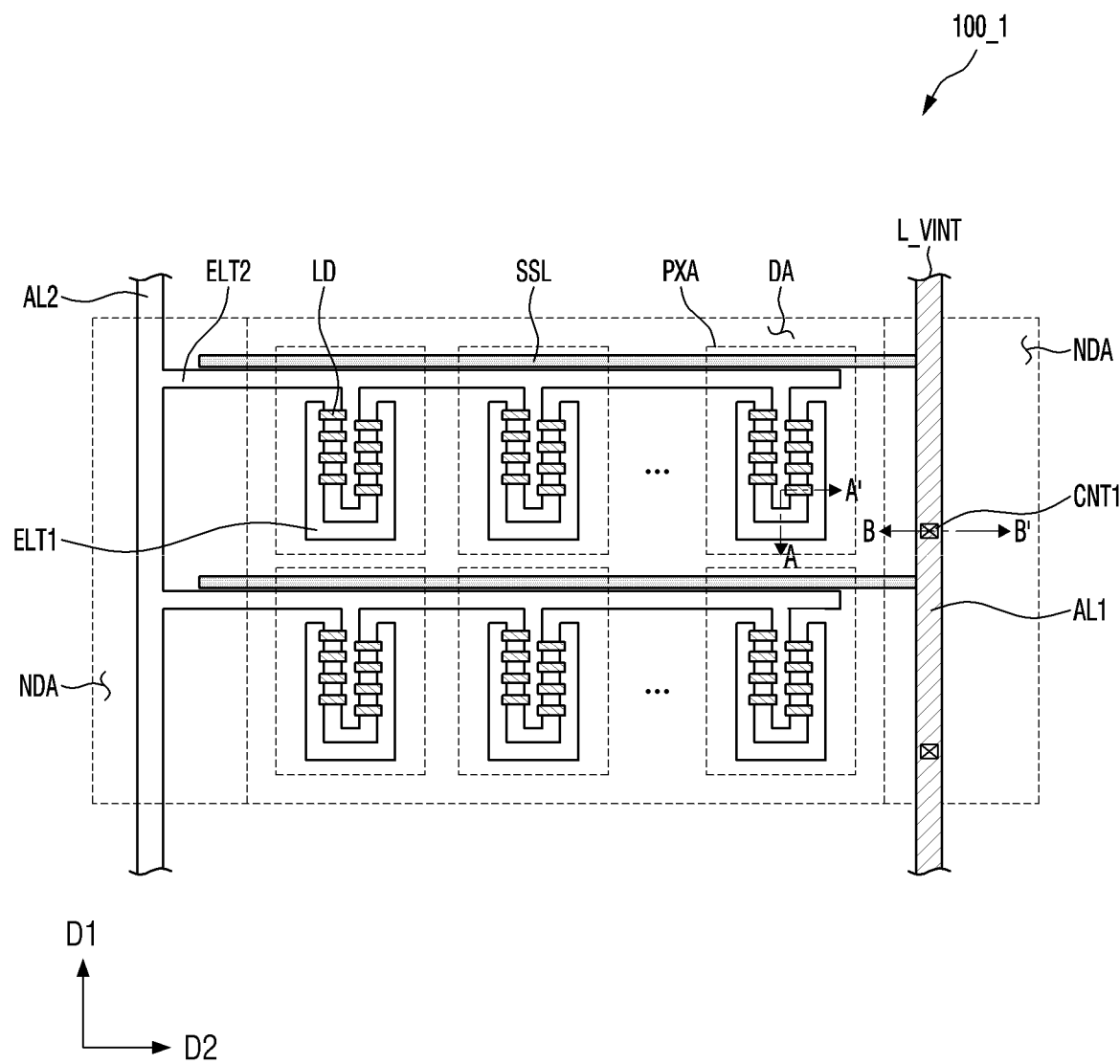

FIGS. 2 and 3 are plan views of display devices according to some embodiments of the present disclosure.

Referring to FIG. 2, the display device 100 may include a sensing line SSL, a reference voltage line L_VINT, first and second pixel electrodes ELT1 and ELT2, and a second line AL2.

The sensing line SSL may be extended in a second direction D2 and may be disposed across the display area DA.

The reference voltage line L_VINT may be extended in a first direction D1 in the non-display area NDA of the display device 100. The reference voltage line L_VINT may be connected to the sensing line SSL, and the reference voltage line L_VINT may be formed integrally with the sensing line SSL.

The second pixel electrodes ELT2 may be extended in the second direction D2 in the display area DA and may be disposed across the plurality of pixel areas PXA. The second pixel electrodes ELT2 may include branch electrodes protruding in the second direction D2 in the pixel areas PXA.

The first pixel electrodes ELT1 may be disposed to face the second pixel electrodes ELT2 in the pixel areas PXA, respectively. The first pixel electrodes ELT1 may be spaced (e.g., spaced apart by a certain distance) from the branch electrodes of the second pixel electrodes ELT2 and may be extended along the edges of the branch electrodes.

As shown in FIG. 2, the second pixel electrodes ELT2 may have a "T" shape when viewed from the top, and the first pixel electrodes ELT1 may have a " 凵 " ("or "U") shape when viewed from the top, which surrounds (or which is around) the T shape. For example, the "U" shaped first pixel electrodes ELT1 may be around the branch electrodes of the second pixel electrodes ELT2.

The second line AL2 may be extended in the first direction D1 in the non-display area NDA, and may be connected to the second pixel electrodes ELT2. The second line AL2 and the second pixel electrode ELT2 may be formed integrally via the same process.

The first pixel electrodes ELT1 may be electrically connected to the reference voltage line L_VINT (or the sensing line SSL).

During the process of aligning the light-emitting diodes LD, the first pixel electrodes ELT1 are electrically connected to the reference voltage line L_VINT (or the sensing lines SSL), and thus a first alignment voltage (e.g., a ground voltage) may be applied to the first pixel electrodes ELT1 through the reference voltage line L_VINT. In some embodiments, a second alignment voltage (e.g., an AC voltage) may be applied to the second pixel electrodes ELT2 through the second line AL2. An electric field may be generated between the first and second pixel electrodes ELT1 and ELT2 in the pixel areas PXA, and the light-emitting diodes LD may be aligned between the adjacent first and second pixel electrodes ELT1 and ELT2 by the electric field.

Although the display device 100 includes a second line AL2 in the example shown in FIG. 1 and FIG. 2, the present disclosure is not limited thereto. For example, as shown in FIG. 3, a display device 100_1 may further include a first line AL1 The first line AL1 may be disposed in the non-display area NDA on the opposite side to the second line AL2 with respect to the display area DA. The second line AL2 may be formed integrally via the same process as the second pixel electrodes ELT2. The first line AL1 may overlap or may be disposed adjacent to the reference voltage line L_VINT, and may be connected in parallel with the reference voltage line L_VINT through a first contact hole CNT1. Accordingly, the resistance of the reference voltage line L_VINT can be reduced, the drop in the voltage (e.g., alignment voltage, reference voltage, etc.) applied to the reference voltage line L_VINT can be mitigated, and the light-emitting diodes LD can be aligned more efficiently.

Incidentally, after the light-emitting diodes LD are arranged between the first and second pixel electrodes ELT1 and ELT2 based on the alignment voltage applied through the reference voltage line L_VINT and the second line AL2, no additional process may be required for the first and second pixel electrodes ELT1 and ELT2. In other words, the first and second pixel electrodes ELT1 and ELT2 may be formed via a single process (e.g., an etching process using one mask) instead of a plurality of processes. As a result, the process of fabricating the display device 100 can be more simplified, and the fabricating efficiency can be improved.

Figure 4:
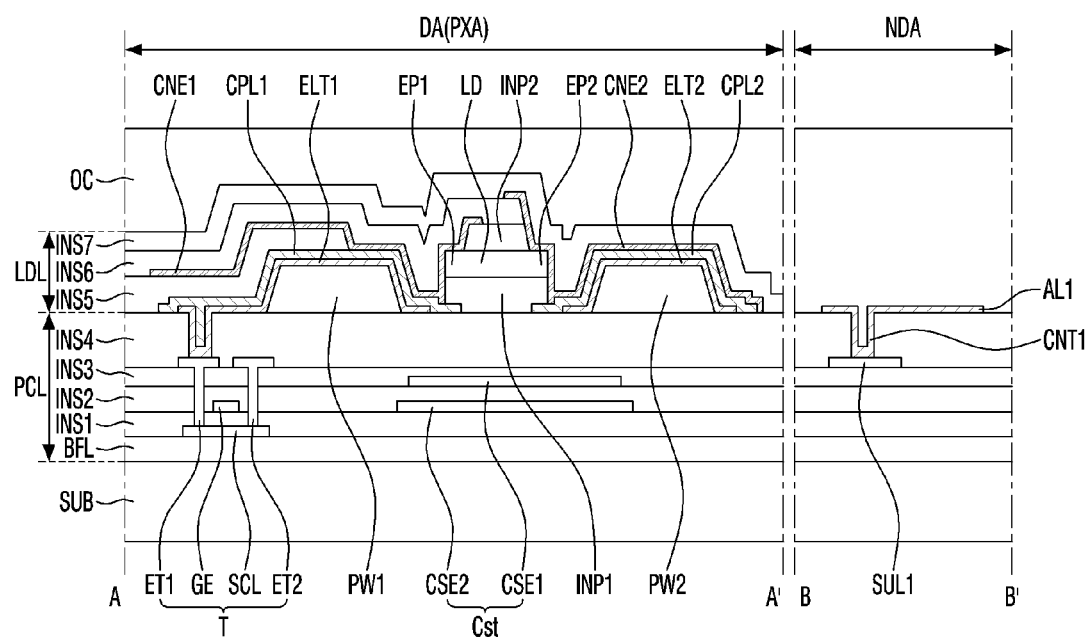
FIG. 4 is a cross-sectional view showing an example of the display device, taken along the lines A-A' and B-B' of FIG. 3.

FIG. 4 is a cross-sectional view showing an example of the display device, taken along the lines A-A' and B-B' of FIG. 3. FIGS. 5-9 are cross-sectional views showing a variety of examples of the display device, taken along the lines A-A' and B-B' of FIG. 3.

Initially, referring to FIGS. 2 and 4, a circuit element layer PCL and a display element layer LDL are sequentially disposed on the substrate SUB in the display area DA. For example, the circuit element layer PCL may be formed on one surface of the substrate SUB, and the display element layer LDL may be formed on the circuit element layer PCL.

The circuit element layer PCL includes circuit elements disposed in the display area DA. The circuit element layer PCL may include circuit elements, which are formed in the pixel areas PXA, respectively, to form pixel circuits PXC. For example, the circuit element layer PCL may include at least one transistor T and a storage capacitor Cst disposed in each of the pixel areas PXA.

Although the pixel PXL includes only one transistor T in the example shown in FIG. 4, this is merely illustrative. The pixel PXL may include a plurality of transistors, and the transistors may have substantially the same or similar cross-sectional structure with the transistor T. In some embodiments, the structure of the transistor T is not limited to the embodiment shown in FIG. 4. For example, the transistor T may have various cross-sectional structures well known in the art. Transistors forming the pixel circuits PXC may have different types and/or structures.

The circuit element layer PCL includes a plurality of insulating layers. The circuit element layer PCL may include first, second, third, and fourth insulating layers INS1, INS2, INS3, and INS4 sequentially stacked on the surface of the substrate SUB. The first, second, third, and fourth insulating layers INS1, INS2, INS3, and INS4 may be sequentially stacked on one another between the substrate SUB and the display element layer LDL. In some embodiments, the circuit element layer PCL may further include at least one buffer layer BFL disposed between the substrate SUB and the circuit elements. At least one of the first to fourth insulating layers INS1, INS2, INS3, and INS4 and the buffer layer BFL may be formed on the surface of the substrate SUB including the display area DA and the non-display area NDA.

The buffer layer BFL can prevent or reduce diffusion of impurities in the transistor T. The buffer layer BFL may be made up of a single layer or multiple layers of two or more layers. When the buffer layer BFL is made up of multiple layers, the layers may be made of the same material or different materials. The buffer layer BFL may be eliminated.

The transistor T includes a semiconductor layer SCL, a gate electrode GE, a first electrode ET1, and a second electrode ET2. Although the transistor T includes the first electrode ET1 and the second electrode ET2 formed separately from the semiconductor layer SCL in the example shown in FIG. 4, the present disclosure is not limited thereto. For example, the first and/or second electrodes ET1 and ET2 of at least one transistor T disposed in the pixel area PXA may be integrated with the semiconductor layer SCL.

The semiconductor layer SCL may be disposed on the buffer layer BF. The semiconductor layer SCL may be disposed between the substrate SUB on which the buffer layer BFL is formed and the first insulating layer INS1. The semiconductor layer SCL may include a first region in contact with the first electrode ET1, a second region in contact with the second electrode ET2, and a channel region located between the first and second regions. One of the first and second regions may be a source region and the other one may be a drain region.

The semiconductor layer SCL may be a semiconductor pattern made of polysilicon, amorphous silicon, oxide semiconductor, etc. In some embodiments, the channel region of the semiconductor layer SCL may be an intrinsic semiconductor as a semiconductor pattern not doped with impurities, and each of the first and second regions of the semiconductor layer SCL may be a semiconductor pattern doped with certain impurities (e.g., certain predetermined impurities).

The gate electrode GE may be disposed on the semiconductor layer SCL with the first insulating layer INS1 interposed therebetween. For example, the gate electrode GE may be disposed between the first and second insulating layers INS1 and INS2, and may overlap at least one region of the semiconductor layer SCL.

The first and second electrodes ET1 and ET2 may be disposed on the semiconductor layer SCL with at least one insulating layer, for example, a plurality of insulating layers interposed therebetween. For example, the first and second electrodes ET1 and ET2 may be disposed between the third and fourth insulating layers INS3 and INS4. The first and second electrodes ET1 and ET2 may be electrically connected to the semiconductor layer SCL. For example, the first and second electrodes ET1 and ET2 may be in contact with the first region and the second region of the semiconductor layer SCL through contact holes penetrating through the first to third insulating layers INS1 to INS3, respectively.

One of the first and second electrodes ET1 and ET2 may be electrically connected to the first pixel electrode ELT1 disposed on the fourth insulating layer INS4 by at least one contact hole penetrating the fourth insulating layer INS4.

The storage capacitor Cst may include first and second capacitor electrodes CSE1 and CSE2 disposed on different layers and spaced from each other. The first capacitor electrode CSE1 may be disposed between the second and third insulating layers INS2 and INS3. The second capacitor electrode CSE2 may be disposed at the same layer as at least one conductive layer forming the transistor T, e.g., at least one of the semiconductor layer SCL, the gate electrode GE, and the first and second electrodes ET1 and ET2. For example, the second capacitor electrode CSE2 may be disposed between the first and second insulating layers INS1 and INS2 together with the gate electrode GE of the transistor T.

Although each of the first and second capacitor electrodes CSE1 and CSE2 is made up of a single layer in the example shown in FIG. 4 for convenience of illustration, the present disclosure is not limited thereto. For example, at least one of the first and second capacitor electrodes CSE1 and CSE2 may be made up of multiple layers. The stack structure and/or positions of the first and second capacitor electrodes CSE1 and CSE2 may be altered in a variety of ways.

According to some embodiments of the present disclosure, the display element layer LDL may include a plurality of light-emitting diodes LD disposed in the display area DA above the circuit element layer PCL. For example, the display element layer LDL may include the light-emitting diodes LD that are formed above the circuit element layer PCL in the respective pixel areas PXA and form the light-emitting diodes LD.

Although only one light-emitting diode LD is shown in FIG. 4 for convenience of illustration, a plurality of light-emitting elements LD may be disposed inside the pixel area PXA. In some embodiments, in the pixel area PXA, the light-emitting diodes LD may be disposed on substantially the same layer and may have the same or similar cross-sectional structure and/or connection structure. In some embodiments, the structure and arrangement of the light-emitting diodes LD are not limited to the embodiment shown in FIG. 4. For example, the light-emitting diodes LD may have a variety of cross-sectional structures and/or connection structures known in the art.

The display element layer LDL may include the first and second pixel electrodes ELT1 and ELT2 disposed in each of the pixel areas PXA, the light-emitting diodes LD disposed between the first and second pixel electrodes ELT1 and ELT2 facing each other, and first and second contact electrodes CNE1 and CNE2 disposed on the first and second ends EP1 and EP2 of each of the light-emitting diodes LD. In some embodiments, the display element layer LDL may further include at least one conductive layer and/or an insulating layer. The display element layer LDL may further include at least one of first and second partition walls PW1 and PW2, first and second capping layers CPL1 and CPL2, and fifth to seventh insulating layers INS5 to INS7.

The first and second partition walls PW1 and PW2 may be disposed on the fourth insulating layer INS4 of the circuit element layer PCL. The first and second partition walls PW1 and PW2 may be disposed on the fourth insulating layer INS4 such that they are spaced from each other (e.g., spaced from each other by a set or predetermined distance). The first and second partition walls PW1 and PW2 may define an emission area within each of the pixel areas PXA.

Figure 9:
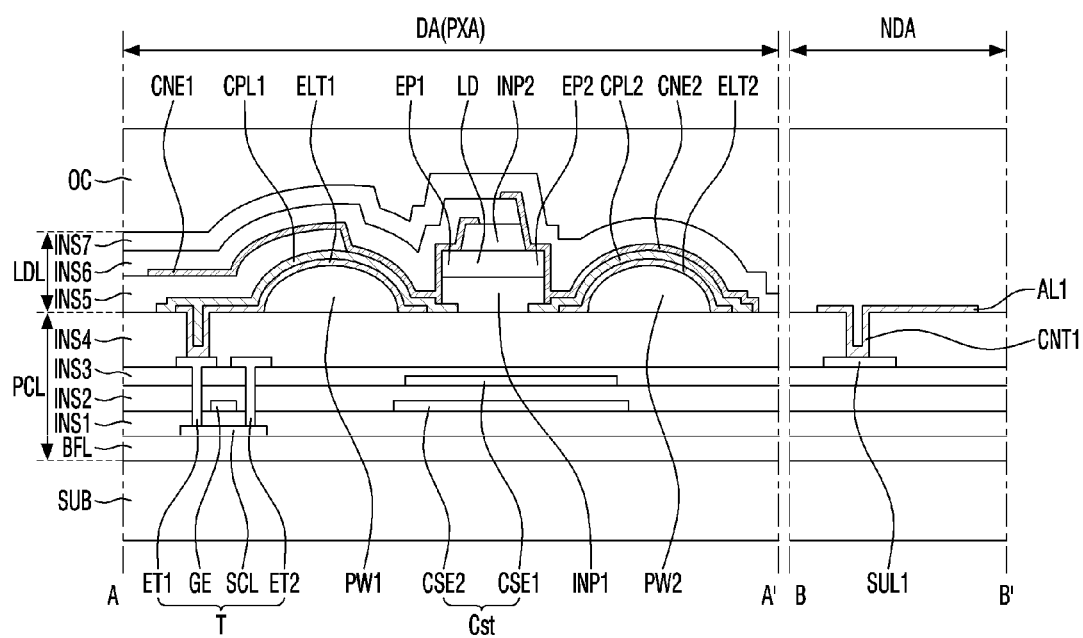

Each of the first and second partition walls PW1 and PW2 may include an insulating material containing an inorganic material or an organic material, but the constituent material forming the first and second partition walls PW1 and PW2 is limited thereto. Each of the first and second partition walls PW1 and PW2 has a trapezoidal shape with inclined side surfaces at a certain angle, but the shape of the first and second partition walls PW1 and PW2 is limited thereto. For example, as shown in FIG. 9, each of the first and second partition walls PW1 and PW2 may have a semi-elliptical shape, or may have various shapes such as a circle and a square.

The first and second pixel electrodes ELT1 and ELT2 may be disposed on the pixel area PXA where the first and second partition walls PW1 and PW2 are disposed. The first and second pixel electrodes ELT1 and ELT2 may be disposed above the substrate SUB on which the first and second partition walls PW1 and PW2 are formed and may be spaced from each other (e.g., spaced from each other by a set or predetermined distance).

The first pixel electrode ELT1 may be disposed on the first partition wall PW1, and the second pixel electrode ELT2 may be disposed on the second partition wall PW2. One of the first and second pixel electrodes ELT1 and ELT2 may be an anode electrode, and the other one may be a cathode electrode.

The first and second pixel electrodes ELT1 and ELT2 may have a shape conforming to the shape of the first and second partition walls PW1 and PW2. For example, the first pixel electrode ELT1 may have a slope equal to the slope of the first partition wall PW1, and the second pixel electrode ELT2 may have a slope equal to the slope of the second partition wall PW2.

In some embodiments, the first and second pixel electrodes ELT1 and ELT2 may be disposed at the same plane and may have the same height or substantially the same height as each other. When the first and second pixel electrodes ELT1 and ELT2 have the same height, the light-emitting diodes LD may be more stably connected between the first and second pixel electrodes ELT1 and ELT2. It is, however, to be understood that the present disclosure is not limited thereto. The shape, structure and/or arrangement relationship of the first and second pixel electrodes ELT1 and ELT2 may be altered in a variety of ways.

The first and second pixel electrodes ELT1 and ELT2 may be, but is not limited to, reflective electrodes. For example, the first and second pixel electrodes ELT1 and ELT2 may be made of a conductive material having a reflectance. For example, the first and second pixel electrodes ELT1 and ELT2 may include at least one of, but is not limited to, metal such as Ag, Mg, Al, Pt, Pd, Au, Ni, Nd, Ir, Cr and an alloy, conductive oxide such as indium tin oxide (ITO), indium zinc oxide (IZO), zinc oxide (ZnO) and indium tin zinc oxide (ITZO), and a conductive polymer such as PEDOT. In some embodiments, each of the first and second pixel electrodes ELT1 and ELT2 may be made up of a single layer or multiple layers, and the stack structure thereof is not limited thereto.

The first and second pixel electrodes ELT1 and ELT2 may guide light emitted from both ends EP1 and EP2 of each of the light-emitting diodes LD toward the side on which an image is displayed, e.g., toward the front side of the display device 100. When the first and second pixel electrodes ELT1 and ELT2 have the inclination conforming to the shape of the first and second partition walls PW1 and PW2, the light emitted from the both ends EP1 and EP2 of the light-emitting diodes LD may be reflected by the first and second pixel electrodes ELT1 and ELT2 to travel toward the front side. Accordingly, the efficiency of light emitted from the light-emitting diodes LD can be improved.

In some embodiments, the first and second partition walls PW1 and PW2 may also work as reflective members. The first and second partition walls PW1 and PW2 may work as reflective members that improve the efficiency of light emitted from each of the light-emitting diodes LD together with the first and second pixel electrodes ELT1 and ELT2 disposed thereon.

The first and second capping layers CPL1 and CPL2 may be disposed on the pixel areas PXA where the first and second pixel electrodes ELT1 and ELT2 are disposed. For example, the first capping layers CPL1 may be disposed on the first pixel electrodes ELT1 to cover the first pixel electrodes ELT1, and the second capping layers CPL2 may be disposed on the second pixel electrodes ELT2 to cover the second electrodes ELT2.

The first and second capping layers CPL1 and CPL2 may be made of a transparent conductive material such as IZO in order to reduce loss of light emitted from each of the light-emitting diodes LD. It is, however, to be understood that the present disclosure is not limited thereto. The constituent material of the first and second capping layers CPL1 and CPL2 may be changed.

The first and second capping layers CPL1 and CPL2 can prevent damage to the first and second pixel electrodes ELT1 and ELT2 due to defects occurring during the process of fabricating the light-emitting display device, and can reinforce the adhesion between the pixel electrodes ELT1 and ELT2 and the circuit element layer PCL. It is, however, to be understood that at least one of the first and second capping layers CPL1 and CPL2 may be eliminated.

First insulating patterns INP1 may be disposed on the pixel areas PXA in which the first and second capping layers CPL1 and CPL2 are disposed. The first insulating patterns INP1 may be disposed between the circuit element layer PCL and each of the light-emitting diodes LD and may cover an area of the first and second capping layers CPL1 and CPL2. The first insulating pattern INP1 can stably support the light-emitting diode LD and can prevent or protect the light-emitting diode LD from deviating. The first insulating patterns INP1 may be formed concurrently (e.g., formed simultaneously) with one of the insulating layers formed in the display element layer LDL or may be formed independently.

The light-emitting diodes LD may be supplied and aligned on the pixel areas PXA where the first insulating patterns INP1 and the like are disposed. The light-emitting diodes LD are guided so that they are self-aligned by an electric field formed between the first and second pixel electrodes ELT1 and ELT2, and may be arranged between the first and second pixel electrodes ELT1 and ELT2 of the pixel areas PXA.

Second insulating patterns INP2 may be disposed on the pixel areas PXA where the light-emitting diodes LD are disposed to cover a part of the upper surface of the light-emitting diodes LD. The second insulating patterns INP2 may be formed concurrently (e.g., formed simultaneously) with one of the insulating layers formed in the display element layer LDL or may be formed independently.

The fifth insulating layer INS5 may be formed on a part of the upper surfaces of the first capping layers CPL1. The fifth insulating layer INS5 may be formed concurrently (e.g., formed simultaneously) with one of the first and second insulating patterns INP1 and INP2, or may be formed independently. The fifth insulating layer INS may be eliminated.

First contact electrode CNE1 may be disposed in the pixel areas PXA where the second insulating patterns INP2, the fifth insulating layer INS5, etc. are disposed. The first contact electrode CNE1 may cover the first capping layer CPL1 and may be electrically connected to the first pixel electrode ELT1 through the first capping layer CPL1. When the first capping layers CPL1 are eliminated, the first contact electrode CNE1 may be disposed directly on the first pixel electrode ELT1 and may be directly connected to the first pixel electrode ELT1. In some embodiments, the first contact electrode CNE1 may cover the first end EP1 of the at least one light-emitting diode LD disposed in the pixel area PXA, and may connect the first end EP1 of the at least one light-emitting diode LD with the respective first pixel electrode ELT1.

A sixth insulating layer INS6 may be disposed on the first contact electrode CNE1 in the pixel area PXA. The sixth insulating layer INS6 may be disposed to cover the first contact electrodes CNE1 and the fifth insulating layer INS5.

The second contact electrode CNE2 may be disposed on the pixel area PXA where the sixth insulating layer INS6, etc. are disposed. The second contact electrode CNE2 may cover the second capping layer CPL2 and may be electrically connected to the second pixel electrode ELT2 through the second capping layer CPL2. When the second capping layer CPL2 is eliminated, the second contact electrode CNE2 may be disposed directly on the second pixel electrode ELT2 and may be directly connected to the second pixel electrode ELT2. In some embodiments, the second contact electrode CNE2 may cover the second end EP2 of at least one light-emitting diode LD disposed in the pixel area PXA, and may connect the second end EP2 of the at least one light-emitting diode LD with the second pixel electrode ELT2.

The seventh insulating layer INS7, an overcoat layer OC, etc. may be disposed in the pixel area PXA where the second contact electrodes CNE2, etc. are disposed. According to an embodiment, the seventh insulating layer INS7 may be disposed on the surface of the substrate SUB including the display area DA and the non-display area NDA, and the overcoat layer OC may cover the upper surface of the seventh insulating layer INS7.

A reference voltage line L_VINT and a first line AL1 (and the second line AL2) may be disposed in the non-display area NDA. The reference voltage line L_VINT may be disposed in the non-display area NDA on the substrate SUB, and the first line AL1 may be disposed to overlap the reference voltage line L_VINT.

Initially, the first line AL1 may be disposed on the fourth insulating layer INS4 of the circuit element layer PCL. The first line AL1 may be disposed at the same layer with at least one of the first and second pixel electrodes ELT1 and ELT2. The first line AL1 may be formed at the same layer as the first and second pixel electrodes ELT1 and ELT2 during a process of forming the first and second pixel electrodes ELT1 and ELT2.

The first line AL1 may be disposed at the same layer with at least one of the first and second capping layers CPL1 and CPL2 and the first and second contact electrodes CNE1 and CNE2. The first line AL1 may be formed at the same layer as the first and second capping layers CPL1 and CPL2 during the process of forming the first and second capping layers CPL1 and CPL2, or may be formed at the same layer as the first and second contact electrodes CNE1 and CNE2 during the process of forming the contact electrodes CNE1 and CNE2.

Figure 8:
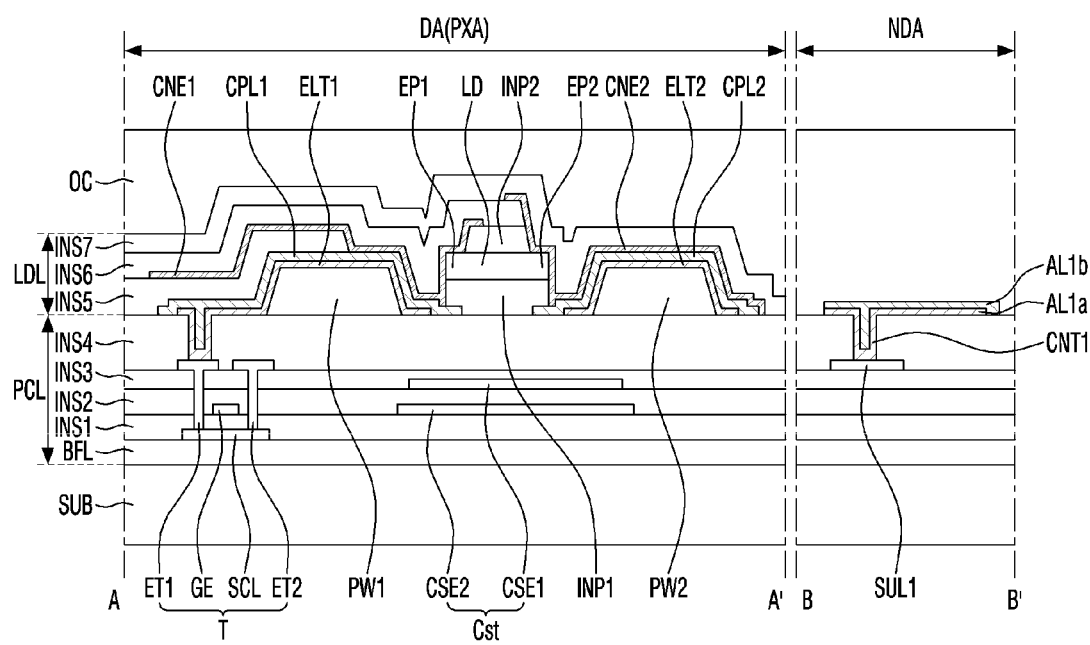

The first line AL1 may have a multi-layer structure including the electrodes disposed on different layers and conductive layers disposed at the same layer from among the first and second pixel electrodes ELT1 and ELT2, the first and second capping layers CPL1 and CPL2, and the first and second contact electrodes CNE1 and CNE2. For example, as shown in FIG. 8, the first line AL1 may include a first conductive line AL1a and a second conductive line AL1b disposed to overlap the first conductive line AL1a. The first conductive line AL1a may be disposed at the same layer as the first and second pixel electrodes ELT1 and ELT2 or the first and second capping layers CPL1 and CPL2. The second conductive line AL1b may be disposed at the same layer as the first and second capping layers CPL1 and CPL2 or the first and second contact electrodes CNE1 and CNE2.

The reference voltage line L_VINT may be disposed at the same layer as at least one electrode formed in the circuit element layer PCL.

For example, as shown in FIG. 4, the reference voltage line L_VINT may include a first sub-line SUL1 disposed between the third and fourth insulating layers INS3 and INS4 together with the first and second electrodes ET1 and ET2 of the transistor T. In such a case, the first line AL1 may be in contact with the first sub-line SUL1 through a first contact hole CNT1 penetrating the fourth insulating layer INS4.

Figure 5:
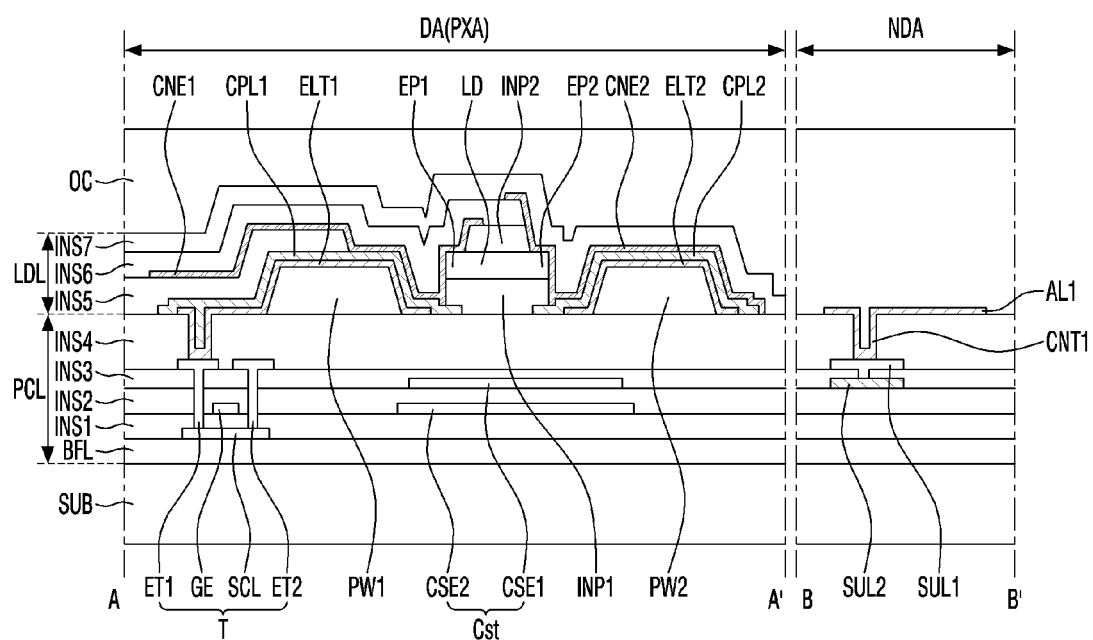
FIGS. 5-9 are cross-sectional views showing a variety of examples of the display device, taken along the lines A-A' and B-B' of FIG. 3.
Figure 6:
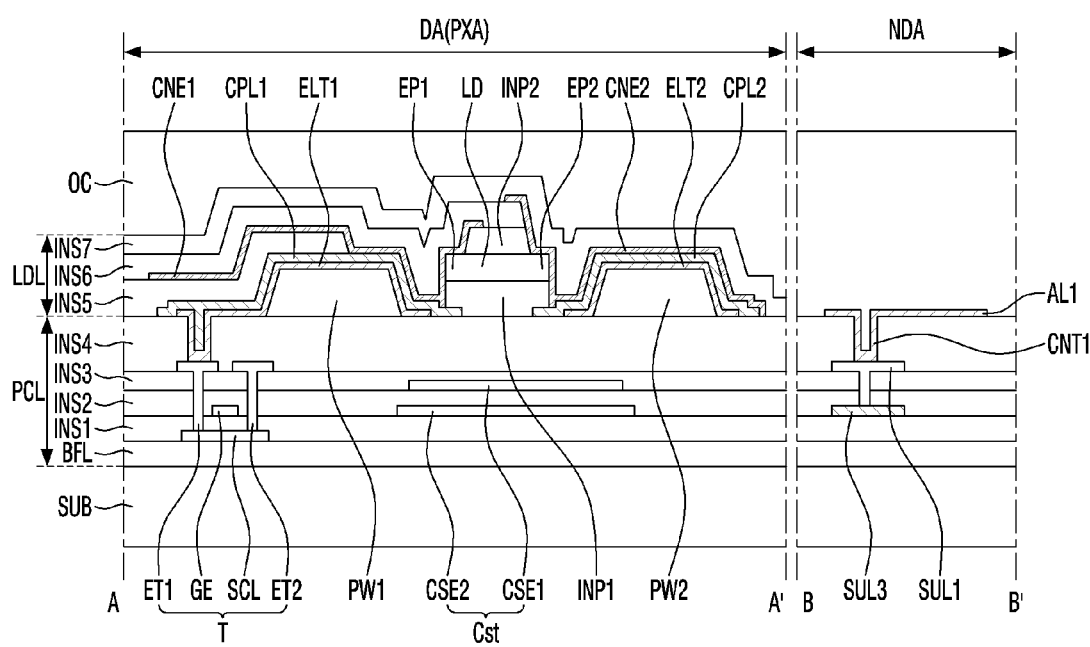
Figure 7:
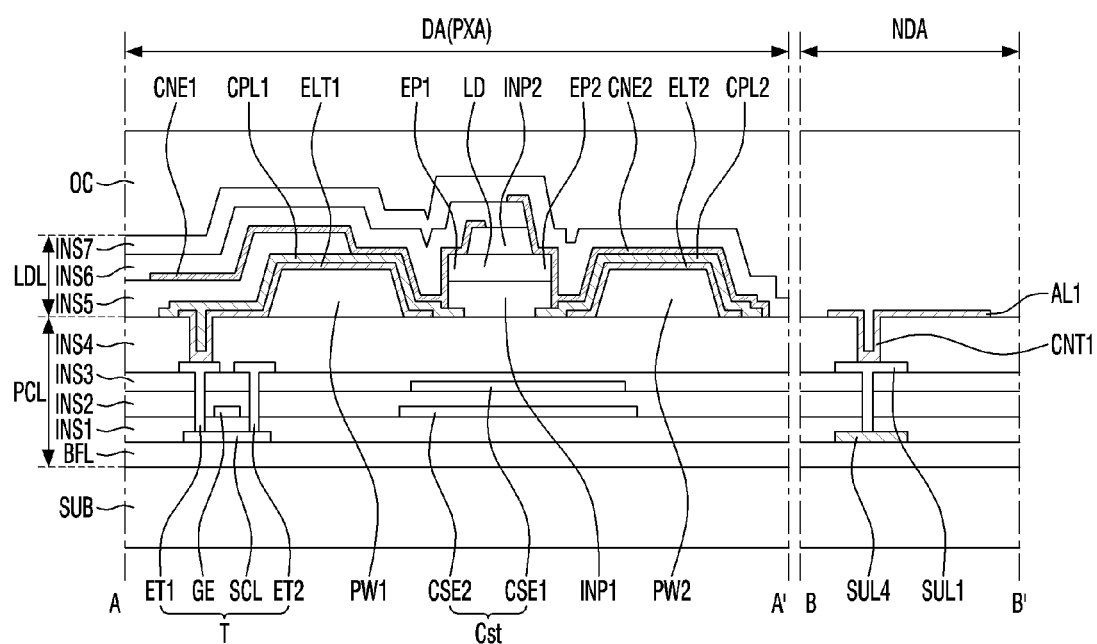

As another example, the reference voltage line L_VINT may further include a second sub-line SUL2 disposed between the second and third insulating layers INS2 and INS3 together with the first capacitor electrode CSE1 as shown in FIG. 5, or may include a third sub-line SUL3 disposed between the first and second insulating layers INS1 and INS2 together with the gate electrode GE of the transistor T and the second capacitor electrode CSE2 as shown in FIG. 6. As another example, as shown in FIG. 7, the reference voltage line L_VINT may include a fourth sub-line SUL4 disposed between the buffer layer BFL on the substrate SUB and the first insulating layer INS1 together with the semiconductor layer SCL of the transistor T.

The reference voltage line L_VINT may have a multi-layer structure including at least two of: the first sub-line SUL1 disposed between the third and fourth insulating layers INS3 and INS4, the second sub-line SUL2 disposed between the second and third insulating layers INS2 and INS3, the third sub-line SUL3 disposed between the first and second insulating layers INS1 and INS2, and the fourth sub-line SUL4 disposed between the substrate SUB (or the buffer layer BFL) and the first insulating layer INS1 from among the sub-lines of each of the first and second alignment lines AL1 and AL2, As described above with reference to FIGS. 4-9, the reference voltage line L_VINT and the first line AL1 may be disposed on the substrate SUB in the non-display area NDA and may have a single-layer structure or a multi-layer structure. Accordingly, the resistances of the reference voltage line L_VINT and the first line AL1 can be reduced, and a drop in the alignment voltage applied during the process of aligning the light-emitting diodes LD can be further prevented or reduced. As a result, the light-emitting diodes LD can be aligned more efficiently. In some embodiments, a drop in the reference voltage applied when the display device 100 is driven can be prevented or reduced, so that characteristic information of the pixel PXL can be obtained more accurately.

Figure 10:
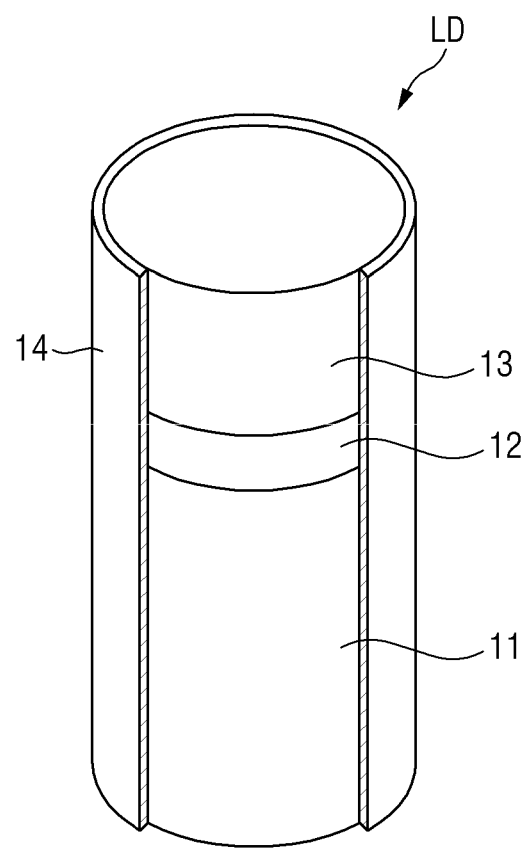
FIG. 10 is a perspective cutaway view showing an example of a light-emitting diode included in the display device of FIG. 1.

FIG. 10 is a perspective cutaway view showing an example of a light-emitting diode included in the display device of FIG. 1.

Referring to FIG. 10, a light-emitting diode LD may include a first conductive semiconductor layer 11, a second conductive semiconductor layer 13, an active layer 12 disposed between the first and second conductive semiconductor layers 11 and 13. The light-emitting diode LD may be configured as a stack in which the first conductive semiconductor layer 11, the active layer 12 and the second conductive semiconductor layer 13 are stacked on one another in this order.

The light-emitting diode LD may have a rod-like shape extended in a direction. Herein, the direction in which the light-emitting diode LD is extended is referred to as the length direction. The light-emitting diode LD may have a first end and a second end along the length direction.

One of the first and second conductive semiconductor layers 11 and 13 may be disposed at the first end of the light-emitting diode LD, while the other one of the first and second conductive semiconductor layers 11 and 13 may be disposed at the second end of the light-emitting diode LD.

The light-emitting diode LD may be fabricated in a rod-like shape. As used herein, the term "rod-like shape" encompasses a rod-like shape or a bar-like shape that is longer in the longitudinal direction (i.e., the aspect ratio is greater than one), such as a circular column and a polygonal column. It is, however, to be understood that the shape of the cross section is not particularly limited herein. For example, the length of the light-emitting diode LD may be larger than its diameter (or the width of the cross section).

The light-emitting diode LD may have a size in microscale or nano-scale, for example, a diameter and/or length of a micro-scale or nano-scale. It is to be noted that the size of the light-emitting diode LD is not limited thereto. For example, the size of the light-emitting diode LD may vary depending on design conditions of a light-emitting display device using the light-emitting diode LD.

The first conductive semiconductor layer 11 may include at least one n-type semiconductor layer. For example, the first conductive semiconductor layer 11 may include a semiconductor material selected from InAlGaN, GaN, AlGaN, InGaN, AlN and InN, and may include n-type semiconductor layer doped with a first conductive dopant such as Si, Ge and Sn. It is to be noted that the constituent material of the first conductive semiconductor layer 11 is not limited thereto, and the first conductive semiconductor layer 11 may include various materials.

The active layer 12 may be disposed on the first conductive semiconductor layer 11 and may be formed in a single- or multiple-quantum-well structure. A cladding layer doped with a conductive dopant may be formed on and/or under the active layer 12. For example, the cladding layer may be formed as an AlGaN layer or an InAlGaN layer. Materials such as AlGaN and AlInGaN may be used to form the active layer 12, and various other materials may form the active layer 12.

When an electric field of a voltage equal to or higher than a suitable level (e.g., a set or predetermined level) is applied across the light-emitting diodes LD, the electron-hole pairs are created in the active layer 12 to allow the light-emitting diode LD to emit light. By controlling the emission of the light-emitting diode LD, the light-emitting diode LD may be utilized as the light source of the pixel.

The second conductive semiconductor layer 13 may be disposed on the active layer 12 and may include a semiconductor layer of a different type from the first conductive semiconductor layer 11. The second conductive semiconductor layer 13 may include at least one p-type semiconductor layer. For example, the second conductive semiconductor layer 13 may include at least one semiconductor material selected from InAlGaN, GaN, AlGaN, InGaN, AlN and InN, and may include p-type semiconductor layer doped with a second conductive dopant such as Mg. It is to be noted that the constituent material of the second conductive semiconductor layer 13 is not limited thereto, and the second conductive semiconductor layer 13 may include various materials.

The light-emitting diode LD may further include additional elements as well as the first conductive semiconductor layer 11, the active layer 12 and the second conductive semiconductor layer 13. The light-emitting diode LD may further include at least one phosphor layer, active layer, semiconductor layer and/or electrode layer disposed on and/or under the first conductive semiconductor layer 11, the active layer 12 and/or the second conductive semiconductor layer 13.

In some embodiments, the light-emitting diode LD may further include an insulating film 14. The insulating film 14 may be formed to surround at least the outer peripheral surface of the active layer 12, and may further surround at least a part of the first and second conductive semiconductor layers 11 and 13.

It is to be noted that a part of the insulating film 14 is removed in FIG. 10 in order to clearly show the stack structure of the light-emitting diode LD. The insulating film 14 may entirely cover the outer peripheral surface (e.g., the side surface of the circular column) of the light-emitting diode LD, except for the both ends. Alternatively, the insulating film 14 may cover only a part of the side surfaces of the first conductive semiconductor layer 11, the active layer 12, and/or the second conductive semiconductor layer 13. In some embodiments, the insulating film 14 may be eliminated.

The insulating film 14 may include a transparent insulating material. For example, the insulating film 14 may include, but is not limited to, at least one insulating material selected from the group consisting of: $SiO_2$, $Si_3N_4$, $Al_2O_3$ and $TiO_2$. That is to say, the insulating film 14 may be made of any of a variety of insulating materials well known in the art.

When the light-emitting diode LD includes the insulating film 14, it is possible to prevent or protect the active layer 12 of the light-emitting diode LD from being electrically connected to the above-described first and second pixel electrodes ELT1 and ELT2 (see FIG. 4). Accordingly, electrical stability of the light-emitting diode LD can be ensured. In some embodiments, because surface defects of the light-emitting diode LD is reduced, lifetime and efficiency of the light-emitting diode LD can be improved. Furthermore, even when the light-emitting diodes LD are arranged close to each other, it is possible to prevent undesirable short circuits between the light-emitting diodes LD.

The light-emitting diode LD may be used as a light source in various types of display devices including a light-emitting display device. For example, by disposing at least one light-emitting diode LD in each pixel area of the display panel, it is possible to form a light-emitting unit of each pixel. It is to be noted that the light-emitting diode LD can find more applications other than display devices. For example, the light-emitting diode LD may also be used for other types of light-emitting devices that require a light source, such as a luminaire.

Although the light-emitting diode LD is a rod-like light-emitting diode having a circular column shape (e.g., a cylindrical shape) in the example shown in FIG. 10, this is merely illustrative. The type and/or shape of the light-emitting diode LD is not limited thereto.

Hereinafter, functionality of the reference voltage line L_VINT when the display device 100 is driven and during the process of fabricating the display device 100 (e.g., the process of aligning the light-emitting diodes LD) will be described.

Figure 11:
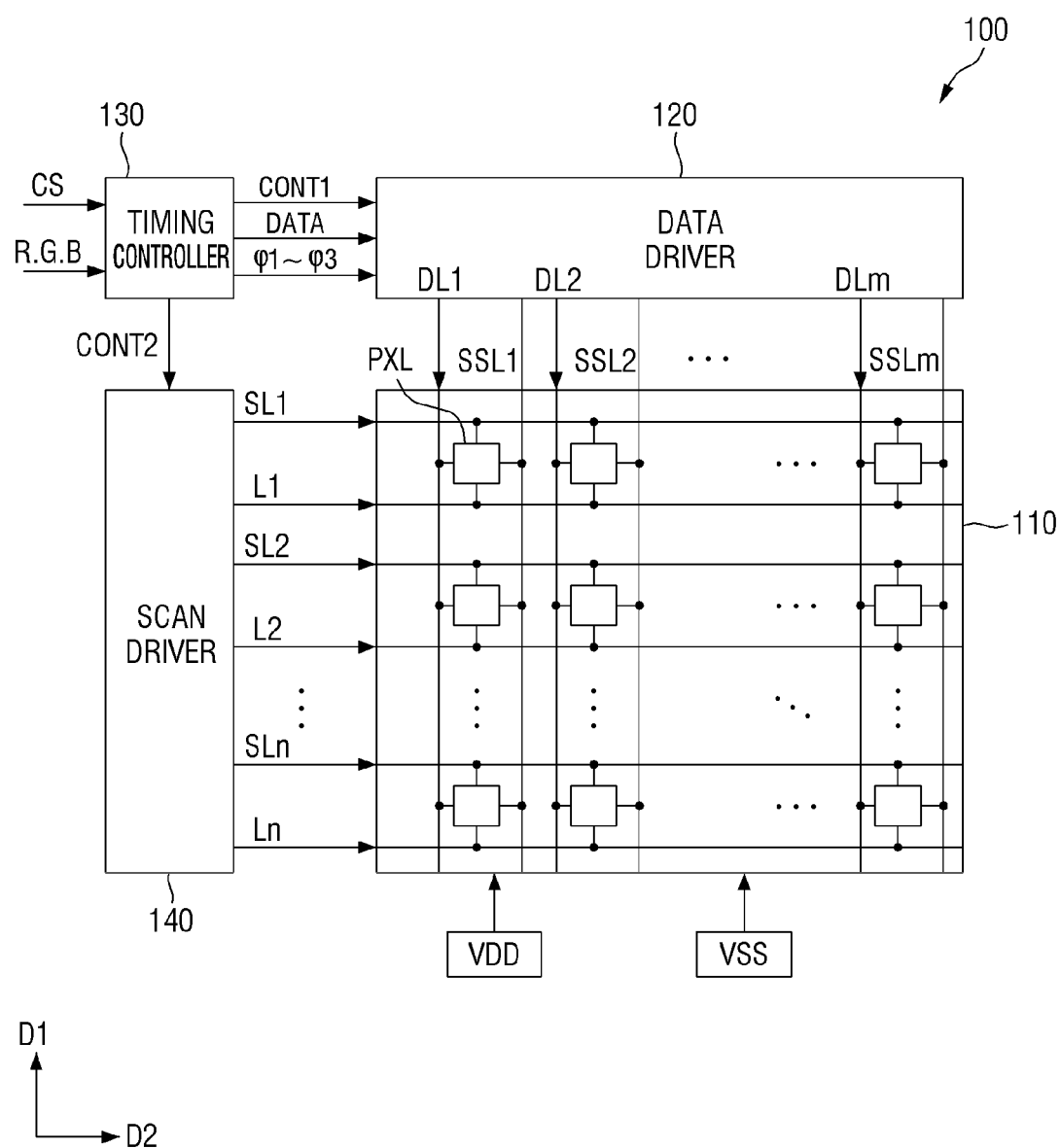
FIG. 11 is a block diagram showing an example of the display device of FIG. 1.
Figure 12:
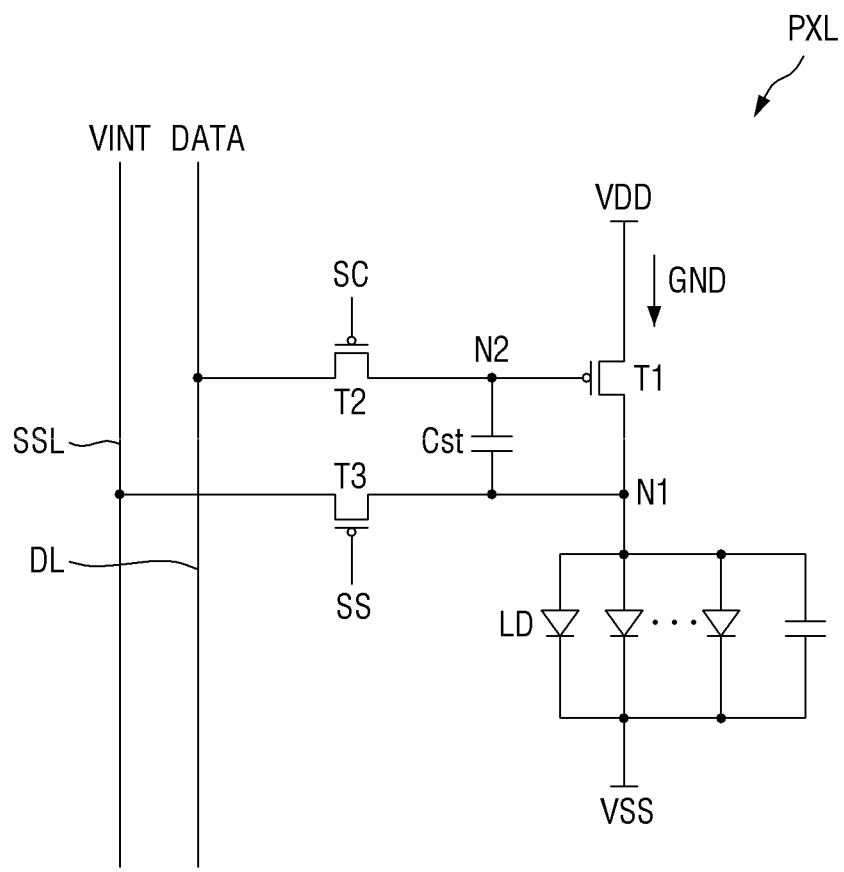
FIG. 12 is a circuit diagram showing an example of one of the pixels included in the display device of FIG. 11.
Figure 13:
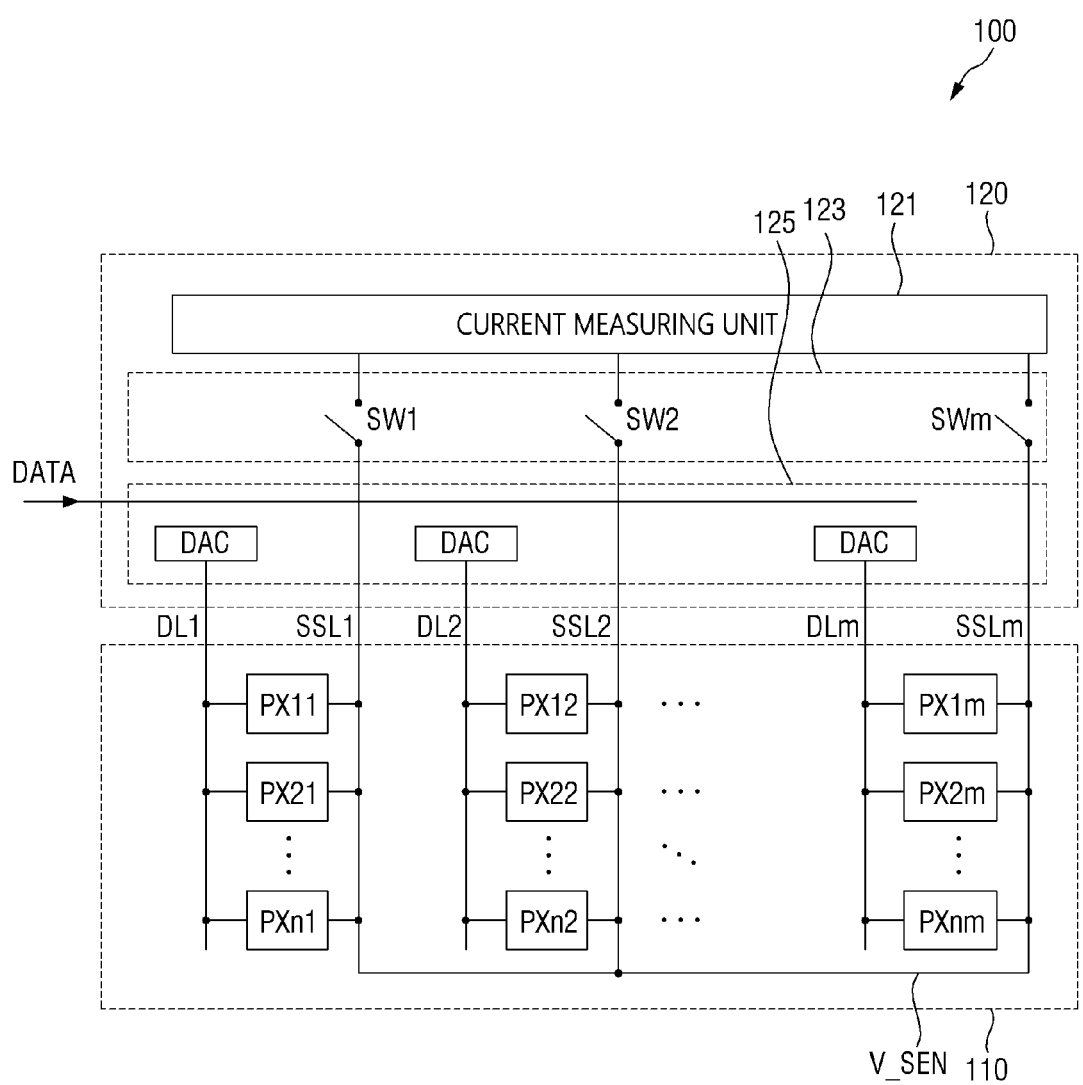
FIG. 13 is a diagram showing an example of a data driver included in the display device of FIG. 11.
Figure 14:
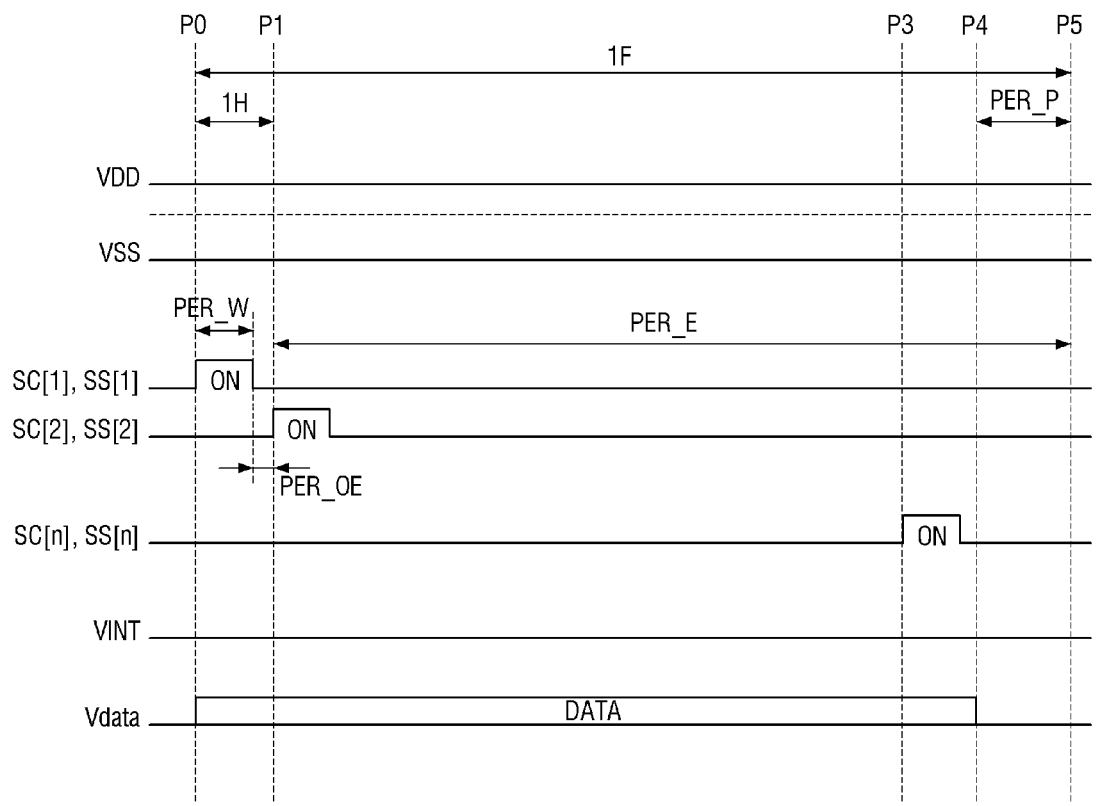
FIG. 14 is a waveform diagram showing an example of signals applied to the pixel of FIG. 12.

FIG. 11 is a block diagram showing an example of the display device of FIG. 1. FIG. 12 is a circuit diagram showing an example of one of the pixels included in the display device of FIG. 11. FIG. 13 is a diagram showing an example of a data driver included in the display device of FIG. 11. FIG. 14 is a waveform diagram showing an example of signals applied to the pixel of FIG. 12.

Referring initially to FIGS. 1, 2, and 11, a display device 100 may include a display panel 110, a data driver 120, a timing controller 130, a scan driver 140, and a power supply.

The display panel 110 may include data lines DL1 to DLm, scan lines SL1 to SLn, sensing lines SSL1 to SSLm, and sensing control lines L1 to Ln, where m and n are integers greater than one. The data lines DL1 to DLm and the sensing lines SSL1 to SSLm may be extended in the first direction D1 and may be arranged along the second direction D2. The scan lines SL1 to SLn and the sensing control lines L1 to Ln may be extended in the second direction D2 and may be arranged along the first direction D1. The pixels PXL may be disposed at positions where the data lines DL1 to DLm, the scan lines SL1 to SLn, the sensing lines SSL1 to SSLm and the sensing control lines L1 to Ln cross one another. The pixel PXL may be connected to one of the data lines DL1 to DLm, one of the scan lines SL1 to SLn, one of the sensing lines SSL1 to SSLm, and one of the sensing control lines L1 to Ln. In some embodiments, the pixel PXL may receive a the first power supply voltage VDD and a second power supply voltage VSS.

The data driver 120 may be connected to the display panel 110 through data lines DL1 to DLm and sensing lines SSL1 to SSLm. The data driver 120 may provide the data signals D1 to Dm to the pixels PXL through the data lines DL1 to DLm under the control of the timing controller 130. In some embodiments, the data driver 120 may provide the reference voltage VINT to the pixels PXL through the sensing lines SSL1 to SSLm and may receive sensing currents from the pixels PXL through the sensing lines SSL1 to SSLm.

The timing controller 130 may receive a control signal CS and image signals R, G, and B from an external system. The control signal CS may include a vertical synchronization signal Vsync, a horizontal synchronization signal Hsync, etc. The image signals R, G, and B may contain luminance information of the pixels PXL, and the luminance may have 1,024, 256 or 64 grayscale levels. The timing controller 130 may divide the image signals R, G, and B per frame in response to the vertical synchronization signal Vsync, and may divide the image signals R, G, and B per scan line in response to the horizontal synchronization signal Hsync, thereby generating image data. The timing controller 130 may provide control signals CONT1 and CONT2 to the data driver 120 and the scan driver 140, respectively, according to the control signal CS and the image signals R, G, and B. The timing controller 130 may provide the image data DATA together with the control signal CONT1 to the data driver 120, and the data driver 120 may sample and hold the image data DATA input in response to the control signal CONT1 and convert it into to analog voltage to generate data signals. Subsequently, the data driver 120 may provide data signals to the pixels PXL through the data lines DL1 to DLm. The timing controller 130 may provide switching control signals φ1 to φ3 for controlling switching operations of the sensing switches SW1 and SW2 to SWm (e.g., see FIG. 13) to the data driver 120.

The scan driver 140 may be connected to the display panel 110 through the scan lines SL1 to SLn and sensing control lines L1 to Ln. The scan driver 140 may sequentially apply scan signals to the scan lines SL1 to SLn in response to a control signal CONT2 provided from the timing controller 130. During a sensing period, the scan driver 140 may provide a sensing signal to a pixel PXL through the sensing line L1 to Ln to measure the current of the pixel PXL.

The power supply may supply driving voltages to the pixels PXL in response to a control signal received from the timing controller 130. The driving voltage may include the first power supply voltage VDD and the second power supply voltage VSS, and the first power supply voltage VDD may have a level higher than the second power supply voltage VSS.

Referring to FIG. 12, the pixel PXL may include a first transistor T1, a second transistor T2, a third transistor T3, a storage capacitor Cst, and light-emitting diodes LD.

The first transistor T1 (e.g., a driving transistor) may include a first electrode receiving the first power supply voltage VDD, a second electrode connected to a first node N1, and a gate electrode (or a control electrode) connected to a second node N2. The first transistor T1 may transmit a driving current to the first node N1 based on the voltage at the second node N2.

The second transistor T2 (e.g., a switching transistor) may include a first electrode connected to the data line, a second electrode connected to the second node N2, and a gate electrode receiving a scan signal SC. The second transistor T2 may provide the data signal DATA provided through the data line to the second node N2 in response to the scan signal SC.

The third transistor T3 may include a first electrode connected to a sensing line, a second electrode connected to the first node N1, and a gate electrode receiving a sensing control signal SS. The third transistor T3 may provide a reference voltage VINT provided through the sensing line to the first node N1 in response to the sensing control signal SS.

The storage capacitor Cst may be connected between the first node N1 and the second node N2 and may store the data signal DATA or hold it for a period of time (e.g., set or predetermined period of time).

The light-emitting diodes LD may be connected in parallel with each other between the first node N1 and a second power line receiving the second power supply voltage VSS. The light-emitting diodes LD may emit light based on the driving current provided through the first transistor T1.

Referring to FIGS. 11 and 13, the data driver 120 may include a current measuring unit 121, a switching unit 123, and a data providing unit 125.

The current measuring unit 121 may be connected to the pixels PX11 to PXnm through sensing lines SSL1 to SSLm. The current measuring unit 121 may work as a current integrator during the sensing period. The sensing period may refer to a period of time for measuring the current flowing through the light-emitting diodes LD (see FIG. 15), and a compensation value for the data signal may be determined based on the measured current. For example, the current measuring unit 121 may include an operational amplifier, a capacitor, etc., and may integrate sensing currents provided from at least some of the pixels PX11 to PXnm by using them.

The current measuring unit 121 may be connected to the sensing lines SSL1 to SSLm through the switching unit 123. The switching unit 123 may include switches SW1 to SWm, and the switches SW1 to SWm may connect sensing lines SSL1 to SSLm with the current measuring unit 121. The switches SW1 to SWm may work individually based on switching control signals provided from the timing controller 130. For example, only the first switch SW1 may be turned on, and then the current measuring unit 121 may measure characteristics of each of the $11^{th}$ to $n1^{th}$ pixels PX11 to PXn1 included in a first pixel column through a first sensing line SSL1. For another example, when only the second switch SW2 is turned on, and then the current measuring unit 121 may measure characteristics of each of the $12^{th}$ to $n2^{th}$ pixels PX12 to PXn2 included in a second pixel column through a second sensing line SSL2. As yet another example, when all of the first to $m^{th}$ switches SW1 to SWm are turned on, the current measuring unit 121 may measure characteristics of all of the pixels included in each pixel row, e.g., a first pixel row including the $11_{th}$ to $1m^{th}$ pixels PX11 to PX1m through the first to $m^{th}$ sensing lines SSL1 to SSLm.

As described above, because the first to $m^{th}$ sensing lines SSL1 to SSLm are connected to the reference voltage line V_SEN (or L_VINT), it is possible to reduce a drop in the sensing voltage for sensing and attenuation in the sensing current in measuring the characteristics of all of the pixels included in a particular pixel row.

The data providing unit 125 may include a plurality of digital-to-analog converters DACs. Each of the DACs may receive a data signal DATA through a main data line and may convert the data signal DATA into an analog signal to provide it to the pixels PX11 to PXnm through the plurality of data lines DL1 to DLm.

Referring to FIGS. 12 and 14, a frame 1F may include a data write period PER_W, an emission period PER_E and a porch period. As used herein, the frame 1F is a duration in which a frame image is displayed. For example, the frame 1F may be less than 1/60 sec. A single frame 1F may include the number of horizontal hours equal to the number of pixel columns (i.e., pixel columns included in the display device 100). For example, a frame 1F may include 800 horizontal hours (800 H) corresponding to the 800 columns, and one horizontal time (1 H) may be approximately 16 ms, for example.

The data write period PER_W is a time for providing the data signal DATA to each of the pixels PXL, and may be less than one horizontal time 1 H. The data write period PER_W is sequentially allocated for pixels one after another, and the data write period PER_W allocated for each pixel row may be separated by a time PER_OE (e.g., a set or predetermined time PER_OE). For example, at a start point P0, the data write period PER_W may be allocated to the first pixel row. Subsequently, at a first time point P1, the data write period PER_W may be allocated to the second pixel row.

The emission period PER_E refers to a time in which each of the pixels PXR emit light in response to the data signal DATA, and may be, for example, 719 horizontal hours (719 H). The emission period PER_E may be allocated after a certain period of time PER_OE has elapsed since the data write period PER_W.

The porch period PER_P may be allocated after the emission period PER_E. The porch period PER_P may distinguish the current frame from the subsequent frame and may be, for example, 80 horizontal hours (80 H).

Each of the first power supply voltage VDD, the second power supply voltage VSS and the reference voltage VINT may have a constant voltage level during a single frame 1F.

The data voltage Vdata may vary every horizontal time (1 H) in response to the data signal DATA and may have a voltage level between approximately 1V and 10V, for example.

During the data write period PER_W for the first pixel row, the first scan signal SC[1] and the first sensing control signal SS[1] may have a logic high level (or turn-on voltage level). Then, the second transistor T2 of the pixel PXL (see FIG. 11) may be turned on in response to the first scan signal SC[1], and the data voltage corresponding to the data signal DATA may be applied to the second node N2. In some embodiments, the third transistor T3 may be turned on in response to the first sensing control signal SS[1], and the reference voltage VINT may be applied to the first node N1. The first transistor T1 may be turned on in response to the node voltage (i.e., a data voltage) at the second node N2 and may transmit the data voltage to the first node N1. It is to be noted that the current path (i.e., the sensing path) is formed through the third transistor T3, and thus the driving current can be moved to the current measuring unit 121 (see FIG. 13) through the sensing line. In other words, while data is written to the pixel PXL, characteristic of the pixel PXL can be measured concurrently (or simultaneously).

As shown in FIG. 14, because the data write period PER_W is sequentially allocated for the pixel rows, the display device 100 may measure the characteristics of the pixels PXL for each pixel row.

As described above with reference to FIGS. 11-14, the display device 100 may measure the characteristics of the pixel PXL by externally compensating them. The display device 100 may measure the characteristics of the pixel PXL while writing data to the pixel PXL. The reference voltage VINT for measuring the characteristics of the pixels PXL may be provided to the pixels PXL through the sensing lines SSL1 and SSL2 to SSLm, and the sensing lines SSL1 and SSL2 to SSLm are connected to one another through the reference voltage line V_SEN or L_VINT. Accordingly, a drop in the reference voltage VINT can be reduced. In some embodiments, attenuation of the sensing current can be reduced through the sensing lines SSL1 and SSL2 to SSLm, and the characteristics of the pixels PXL can be measured more accurately.

Figure 15:
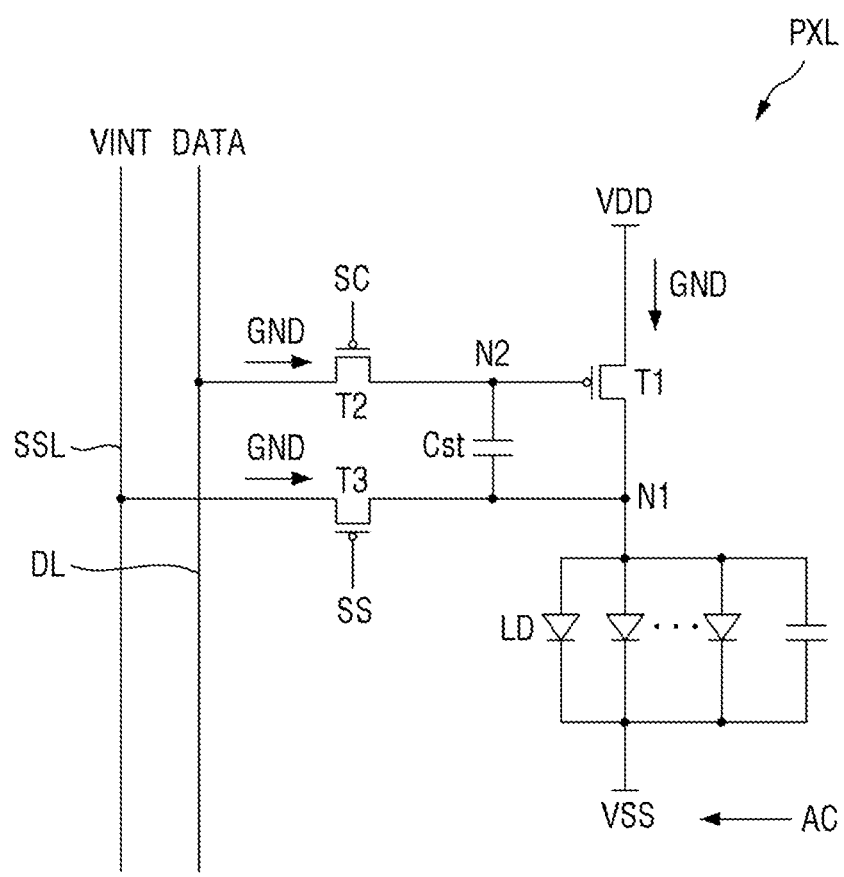
FIG. 15 is a circuit diagram showing an example of a pixel disposed in a pixel area included in the display device of FIG. 11.

FIG. 15 is a circuit diagram showing an example of a pixel disposed in a pixel area included in the display device of FIG. 11. The pixel PXL of FIG. 15 is substantially identical or similar to the pixel PXL of FIG. 12; and, therefore, the redundant descriptions will be omitted.

Referring to FIGS. 12 and 15, during the process of aligning the light-emitting diodes LD, an AC voltage may be applied to a second pixel electrode ELT2 (i.e., the second power supply voltage terminal VSS) through the second line AL2, and a ground voltage GND may be applied to a first pixel electrode ELT1 through the reference voltage line V_SEN (or the sensing line SSL or L_VINT).

For example, when a sensing control signal SS at a turn-on voltage level (e.g., a low level voltage) is applied to a third transistor T3 of the pixel PXL of FIG. 15, the third transistor T3 may be turned on, and a sensing line SSL may be electrically connected to a first node N1. Therefore, the ground voltage GND applied to the reference voltage line V_SEN (or L_VINT) may be applied to the first node N1 (i.e., the first pixel electrode ELT1) through the sensing line SSL and the third transistor T3.

According to an embodiment of the present disclosure, during the process of aligning the light-emitting diodes LD, the ground voltage GND may be additionally applied to the second node N2 through the data line. For example, when a scan signal SC at the turn-on voltage level (e.g., a low level voltage) is applied to the second transistor T2, the second transistor T2 may be turned on, and the second node N2 may be electrically connected to the data line, such that the ground voltage GND may be applied to the second node N2 through the data line and the second transistor T2.

The voltage fluctuation at the first node N1 can be reduced by the node voltage at the second node N2, and the light-emitting diodes LD can be aligned more efficiently between the first and second pixel electrodes ELT1 and ELT2.

According to an embodiment of the present disclosure, during the process of aligning the light-emitting diodes LD, the ground voltage GND may be additionally applied to the first node N1 through the first power supply voltage terminal VDD. For example, when a data signal at the turn-on voltage level is applied, a scan signal at the turn-on voltage level is applied, and the first power supply voltage has the ground voltage level, the first transistor T1 may be turned on and the first power supply voltage terminal VDD may be electrically connected to the first node N1. The ground voltage GND applied through the first power supply voltage terminal VDD increases the ground voltage GND applied to the first node N1 through the third transistor T3, thereby suppressing fluctuations in the ground voltage GND. Further, the light-emitting diodes LD can be aligned more efficiently.

As described above with reference to FIG. 15, the ground voltage GND is applied to the first pixel electrode ELT1 through the third transistor T3 of the pixel PXL in the display device 100, and thus the light-emitting diodes LD can be aligned between the first and second pixel electrodes ELT1 and ELT2 in the pixel area PXA without a process of forming or removing a separate first line AL1. In some embodiments, by applying the ground voltage GND as the data signal and turning on the second transistor T2 of the pixel PXL, it is possible to mitigate fluctuations in the ground voltage GND applied to the first pixel electrode ELT1 through the storage capacitor Cst. Furthermore, by applying the data signal at the turn-on voltage level and the first power supply voltage VDD at the ground voltage GND level to the pixel PXL, and turning on the second and third transistors T2 and T3, it is possible to increase the ground voltage GND applied to the first pixel electrode ELT1. Accordingly, a desired voltage difference is applied between the first and second pixel electrodes ELT1 and ELT2, and the light-emitting diodes LD can be aligned more efficiently.

Although the pixel PXL includes the three transistors in the example shown in FIG. 15, the present disclosure is not limited thereto. The pixel PXL may have the same pixel structure as a pixel PXL_1 to be described later with reference to FIG. 21.

Figure 16:
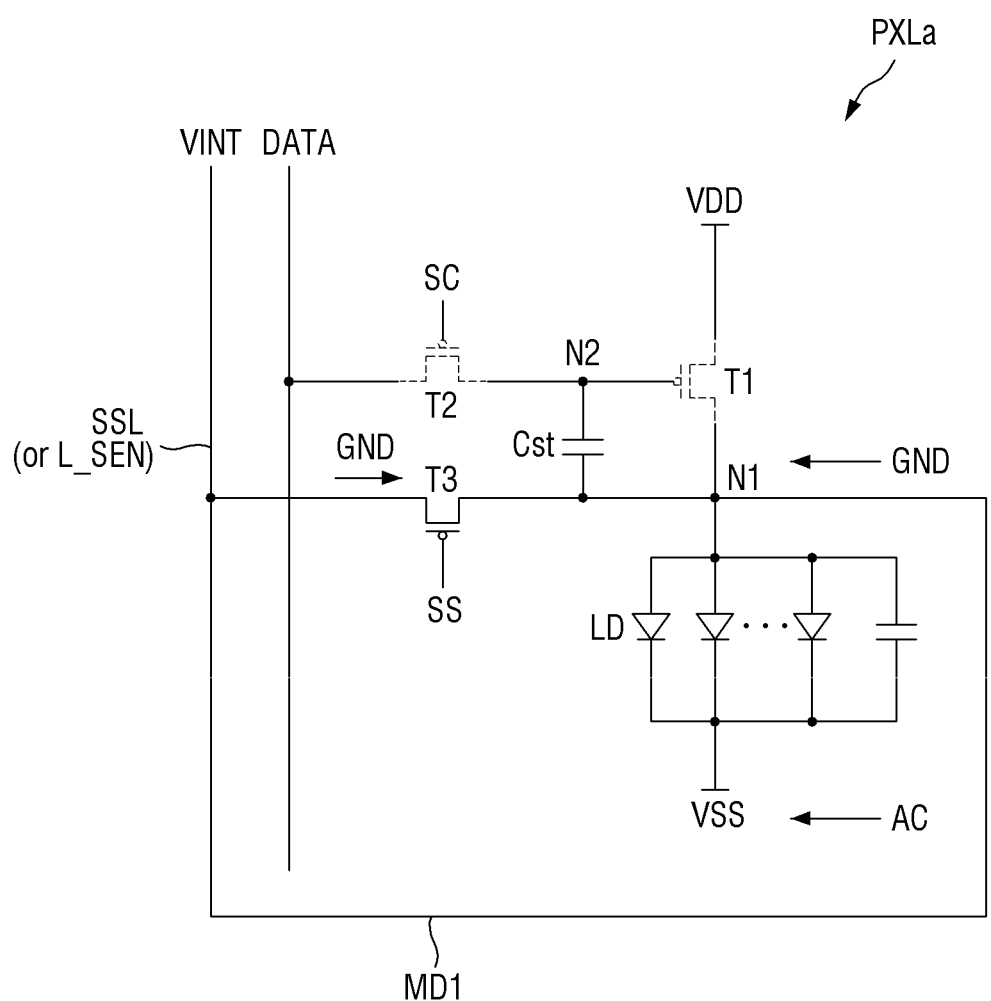
FIGS. 16 and 17 are circuit diagrams showing other examples of a pixel included in the display device of FIG. 11.
Figure 17:
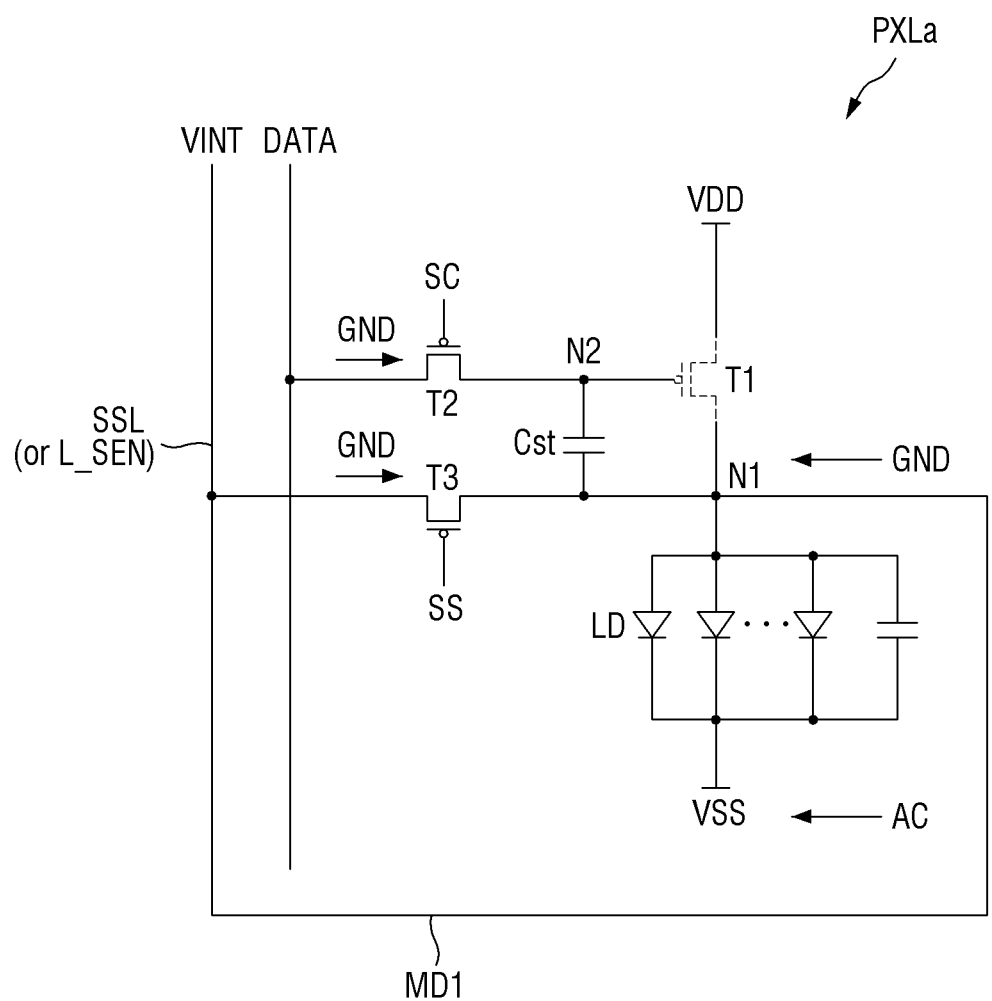
Figure 18:
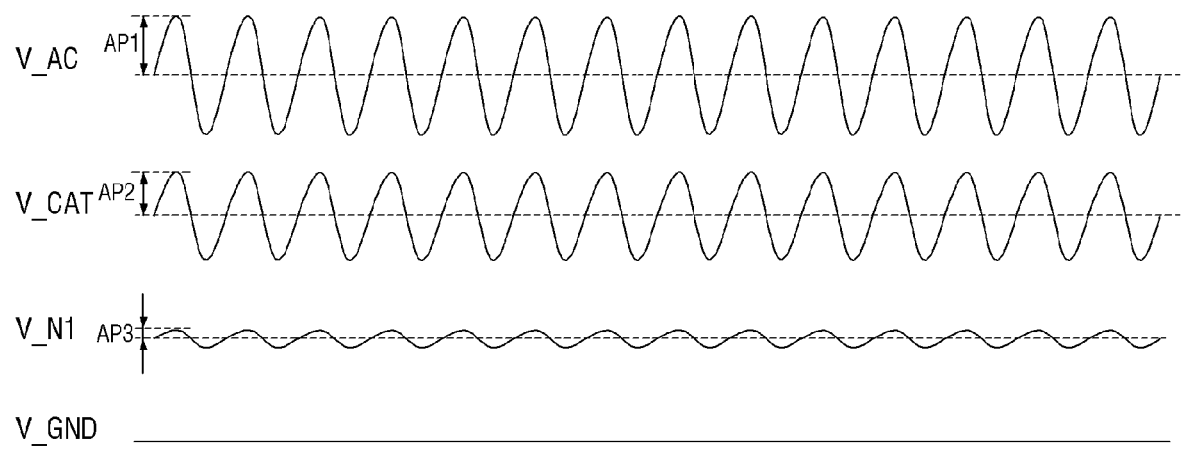
FIG. 18 is a waveform diagram showing an example of signals measured in the pixel of FIG. 17.

FIGS. 16 and 17 are circuit diagrams showing other examples of a pixel included in the display device of FIG. 11. FIGS. 16 and 17 show the counterparts of the pixel of FIG. 15. FIG. 18 is a waveform diagram showing an example of signals measured in the pixel of FIG. 17.

Referring to FIG. 16, because a common electrode MD1 is connected to a reference voltage line L_SEN (or L_VINT), a ground voltage GND applied to a first line AL1 may be applied to the reference voltage line L_SEN (or L_VINT) through common electrode MD1 in the process of aligning the light-emitting diodes LD. In this regard, when the third transistor T3 is turned on in response to a sensing control signal SS, the first node N1 may be electrically connected to the reference voltage line L_SEN (or L_VINT). The sensing control signal SS may be provided from the scan driver 140 described above with reference to FIG. 11.

As shown in FIG. 15, because the common electrode MD1 and the second pixel electrode ELT2 are disposed adjacent to each other, the common electrode MD1 and the second pixel electrode ELT2 may be capacitively coupled with each other. Accordingly, as shown in FIG. 18, the node voltage V_N1 at the first node N1 may have a waveform of an alternating current, rather than a constant voltage waveform like the ground voltage V_GND. As the path from the point where the ground voltage V_GND is applied to the first node N1 is longer, the resistance component of the path increases, and accordingly, the third amplitude AP3 of the node voltage V_N1 may increase. Because the path from the point where the ground voltage V_GND is applied to the first node N1 is formed by parallel connection of the common electrode MD1 and the reference voltage line L_SEN (or L_VINT), the resistance component of the path can be reduced and the amplitude AP3 of the node voltage V_N1 can decrease.

The AC voltage V_AC applied through the second line AL2 may be dropped by the resistance component of the second pixel electrode ELT2, and the electrode voltage V_CAT at the second pixel electrode ELT2 may have a second amplitude AP2 smaller than the first amplitude AP1 of the AC voltage V_AC.

As the voltage difference between the electrode voltage V_CAT and the node voltage V_N1 increases, a larger electric field is formed between the common electrode MD1 and the second pixel electrode ELT2 in the pixel area PXA, so that the light-emitting diodes LD can be aligned more efficiently.

According to some embodiments, during the process of aligning the light-emitting diodes LD, the ground voltage GND may be applied to the data line DL and the scan signal SC having the turn-on voltage may be applied to the second transistor T2.

As shown in FIG. 17, when the second transistor T2 is turned on in response to the scan signal SC, the second node N2 may be electrically connected to the data line DL. Further, the data line DL and the first node N1 (i.e., the common electrode MD1 and the reference voltage line L_SEN (or L_VINT)) may be capacitively connected to each other through the storage capacitor Cst. When the data signal DATA having the ground voltage GND is applied, the fluctuations of the node voltage V_N1 of the first node N1 can be more suppressed by the storage capacitor Cst.

TABLE 1

| Type | Amplitude of AC voltage (AP1) | Conditions | | | |
|---|---|---|---|---|---|
| | | Prior art | T2 ON | T3 ON | T2, T3 ON |
| ΔV | 20 [V] | 5 [V] | 9.7 [V] | 12.3 [V] | 17.3 [V] |
| Uniformity | — | 20% | 49% | 62% | 87% |

Table 1 shows voltage difference (ΔV) across the common electrode MD1 and the second electrode ELT2 in the pixel area PXA (i.e., the difference between the second amplitude AP2 of the electrode voltage V_CAT and the third amplitude AP3 of the node voltage V_N1) depending on whether the second transistor T2 and the third transistor T3 are turned on or turned off. When the second transistor T2 and the third transistor T3 are turned off, the voltage difference ΔV is equal to approximately 20% of the AC voltage V_AC. When the second transistor T2 is turned on (i.e., when the storage capacitor Cst is used), the voltage difference ΔV increases to approximately 49% of the AC voltage V_AC. When the third transistor T3 is turned on, (i.e., when the reference voltage line L_SEN (or L_VINT) is used), the voltage difference ΔV increases to approximately 62% of the AC voltage V_AC. When the second transistor T2 and the third transistor T3 are turned on, the voltage difference ΔV increases to approximately 87% of the AC voltage V_AC. That is to say, during the process of aligning the light-emitting diodes LD, by turning on the second transistor T2 and the third transistor T3, the alignment efficiency may be improved up to approximately 4 times.

Referring back to FIG. 15, once the light-emitting diodes LD have been supplied and aligned, the first pixel electrode ELT1 is separated between the pixel areas PXA so that the pixels PXL can be independently driven. For example, the first pixel electrode ELT1 may be formed by removing the connection electrode A_E of the common electrode MD1 via an etching process or the like. The connection electrode A_E may be a part of the common electrode MD1 located between the pixel area PXA and another pixel area and between the pixel area PXA and the first line AL1.

The second pixel electrode ELT2 may remain connected between the pixel areas PXA. In some embodiments, the second line AL2 may remain connected to the pixels PXL in the display area DA. It is, however, to be understood that the present disclosure is not limited thereto. According to another embodiment, the second pixel electrodes ELT2 may also be separated from each other between the pixel areas PXA.

Subsequently, although not shown in FIG. 15, first and second contact electrodes CNE1 and CNE2 are formed at both ends of each of the light-emitting diodes LD, respectively, so that the both ends of each of the light-emitting diodes LD are physically and/or electrically connected to the first and second pixel electrodes ELT1 and ELT2, respectively, as described with reference to FIG. 4. In some embodiments, the process of forming the first and second contact electrodes CNE1 and CNE2 may be carried out prior to the process of forming the first pixel electrode ELT1.

As described above with reference to FIGS. 16-18, during the process of aligning the light-emitting diodes LD, the third transistor T3 in the pixel PXL is turned on, and the data signal DATA of the ground voltage GND is applied to turn on the second transistor T2, so that the alignment efficiency of the light-emitting diodes LD can be greatly improved.

Figure 19:
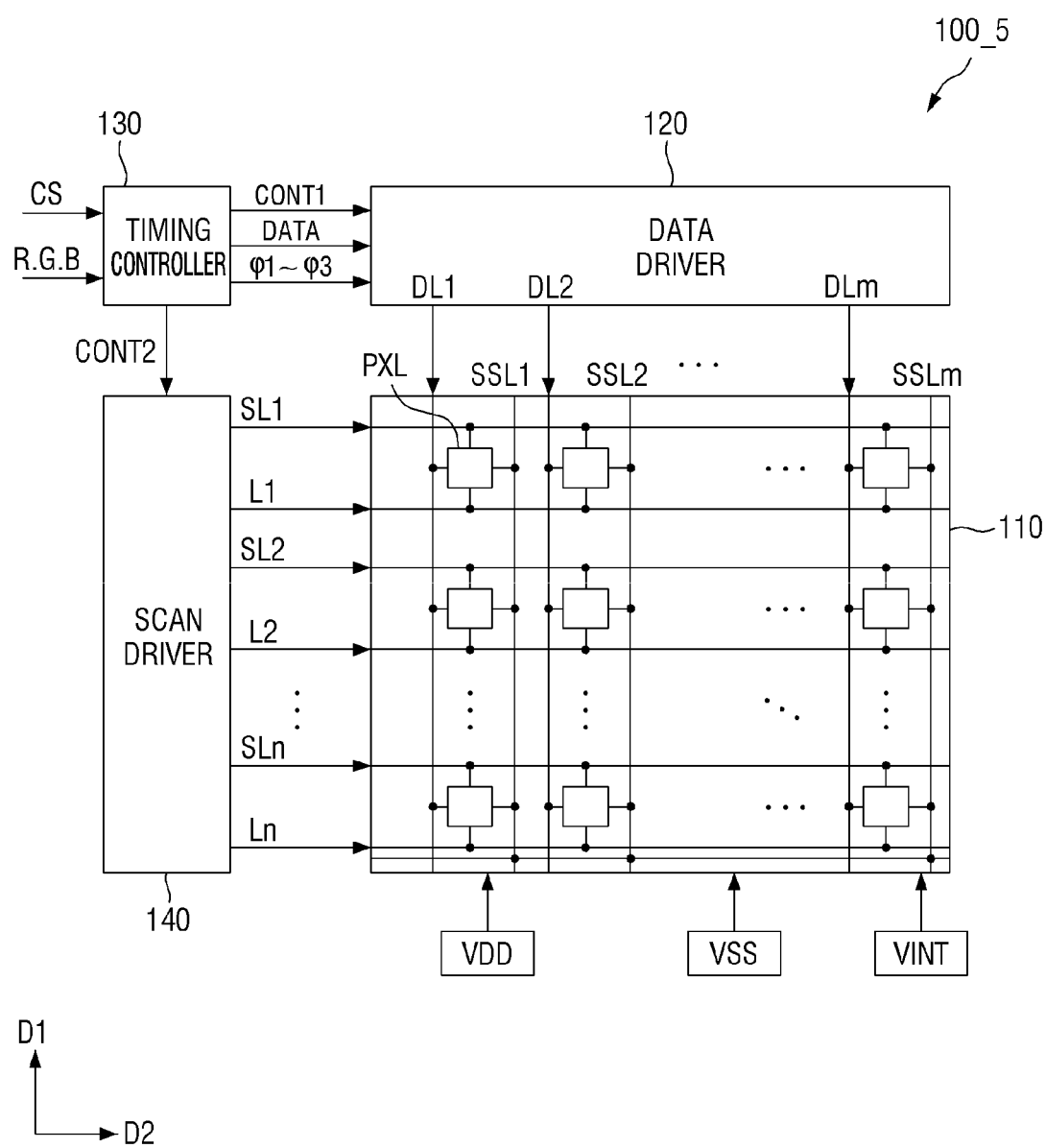
FIGS. 19 and 20 are block diagrams showing other examples of the display device of FIG. 1.
Figure 20:
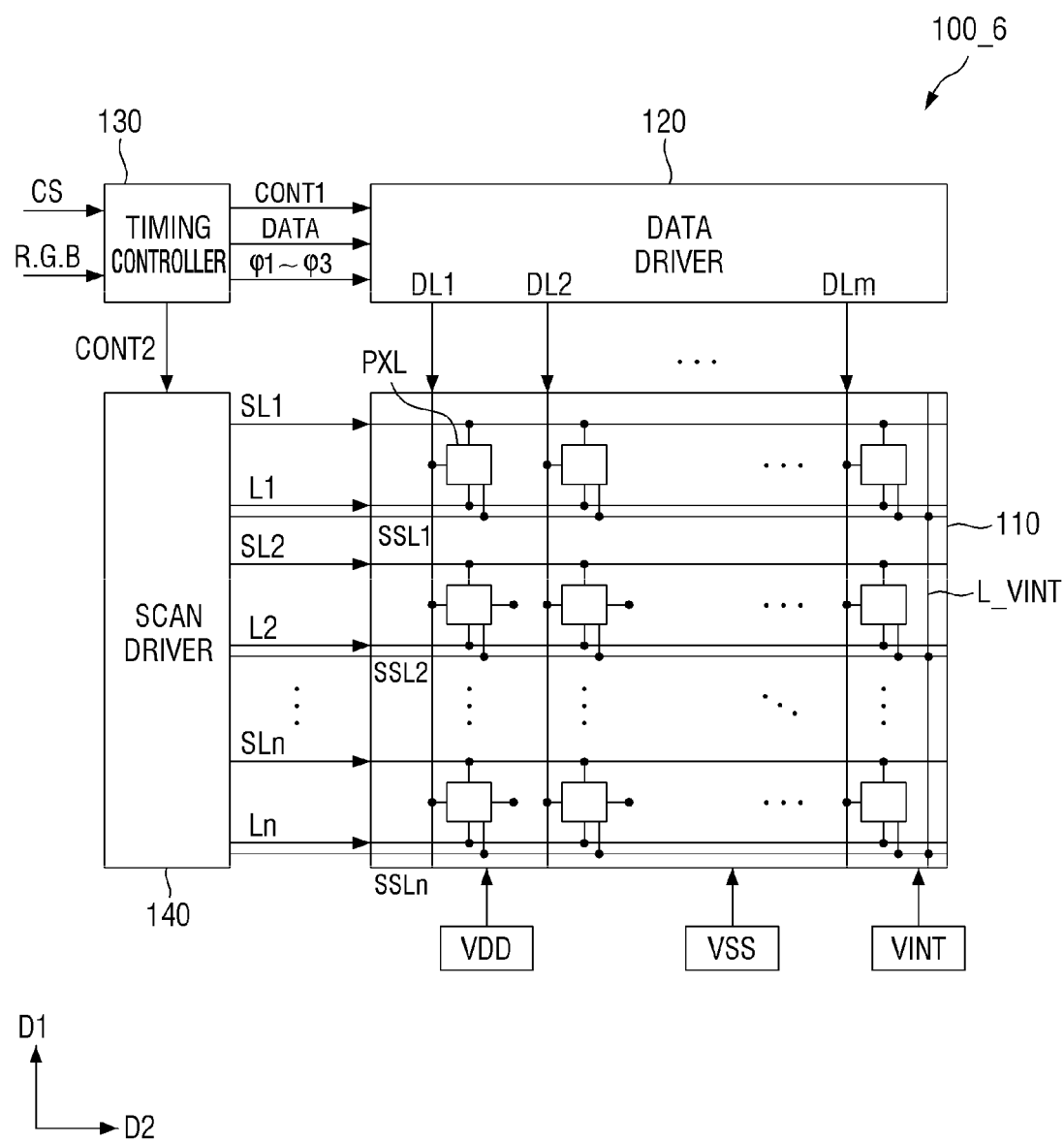
Figure 21:
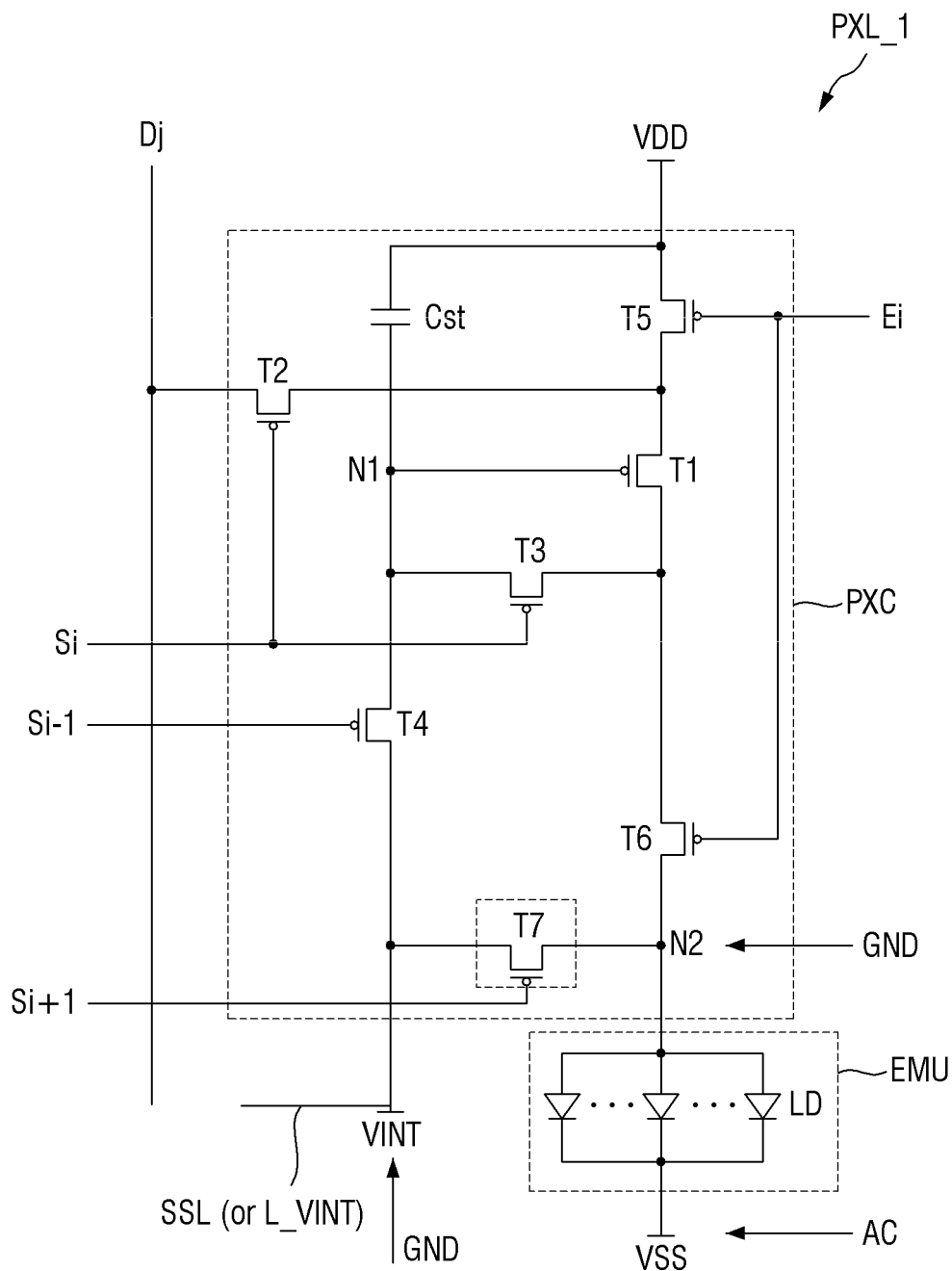
FIG. 21 is a circuit diagram showing an example of one of the pixels included in the display device of FIG. 19.

FIGS. 19 and 20 are block diagrams showing other examples of the display device of FIG. 1. FIGS. 19 and 20 are corresponding block diagrams of the circuit diagram of FIG. 11. FIG. 21 is a circuit diagram showing an example of one of the pixels included in the display device of FIG. 19.

Initially, a display device 100_5 of FIG. 19 is substantially identical to the display device 100 of FIG. 11 except for sensing lines SSL1 to SSLm; and, therefore, the redundant descriptions will be omitted.

The sensing lines SSL1 to SSLm may be extended in the first direction D1 to traverse the display panel 110 and may be spaced from one another in the second direction D2. The sensing lines SSL1 to SSLm may be electrically connected with one another through a reference voltage line (e.g., L_VINT) at one end of the display panel 110 (for example, the non-display area NDA described above). In another embodiments, the sensing lines SSL1 to SSLm are not connected to the data driver 120 but to a power supply, and a reference voltage VINT may be applied to the sensing lines SSL1 to SSLm from the power supply.

Although the sensing lines SSL1 to SSLm are extended in the first direction D1 in the example shown in FIG. 19, the present disclosure is not limited thereto.

Referring to FIG. 20, sensing lines SSL1 to SSLn may be extended in the second direction D2 and may be spaced t from each other in the first direction D1. In some embodiments, the sensing lines SSL1 to SSLn may be electrically connected to each other through the reference voltage lines (e.g., L_VINT), and may receive a reference voltage VINT from a power supply.

Referring to FIG. 21, a pixel PXL_1 may include an emission unit EMU for generating light having a luminance corresponding to a data signal, and a pixel circuit PXC for driving the emission unit EMU.

The emission unit EMU may include light-emitting diodes LD connected in parallel between the first and second power supply voltages VDD and VSS (or the first and second power supply voltage terminals). The first and second power supply voltages VDD and VSS may have different potentials so that the light-emitting diodes LD can emit light. For example, the first power supply voltage VDD may be set as a high-level power supply voltage, and the second power supply voltage VSS may be set as a low-level power supply voltage. During the emission period of the pixel PXL, a difference between the first and second power supply voltage VDD and VSS may be set to be equal to or greater than the threshold voltage of the light-emitting diodes LD.

The emission unit EMU may emit light with a luminance proportional to the driving current supplied through the pixel circuit PXC.

The pixel circuit PXC may be connected to a scan line Si and a data line Dj of the pixel PXL. For example, when the pixel PXL is disposed in the $i^{th}$ row and $j^{th}$ column of the display area DA, the pixel circuit PXC of the pixel PXL may be connected to the $i^{th}$ scan line Si and the $j^{th}$ data line Dj of the display area DA.

In some embodiments, the pixel circuit PXC may be further connected to at least another scan line. For example, each of the pixels PXL arranged in the $i^{th}$ row of the display area DA may be further connected to the $(i-1)^{th}$ scan line Si−1 (e.g., a previous scan line) and/or the (i+1)th scan line Si+1 (e.g., a scan line of a subsequent stage) (or the $i^{th}$ sensing control line SLi). In some embodiments, the pixel circuit PXC may be further connected to a third voltage source in addition to the first and second power supply voltages VDD and VSS. For example, the pixel circuit PXC may be connected to the reference voltage VINT (or reference voltage source or initialization voltage source) as well.

The pixel circuit PXC may include first to seventh transistors T1 to T7 and a storage capacitor Cst.

One electrode of the first transistor T1 (e.g., a driving transistor), for example, a source electrode may be connected to the first power supply voltage VDD via the fifth transistor T5. Another electrode thereof, for example, a drain electrode may be connected to one end of each of the light-emitting diodes LD via the transistor T6. The gate electrode of the first transistor T1 may be connected to the first node N1. The first transistor T1 controls the driving current flowing between the first power supply voltage VDD and the second power supply voltage VSS via the light-emitting diodes LD in response to the voltage at the first node N1.

The second transistor T2 (e.g., a switching transistor) is connected between the data line Dj and the source electrode of the first transistor T1. In some embodiments, the gate electrode of the second transistor T2 is connected to the scan line Si. The second transistor T2 is turned on when a scan signal of a gate-on voltage (e.g., a low voltage) is supplied from the scan line Si, to electrically connect the data line Dj with the source electrode of the first transistor T1. Accordingly, when the second transistor T2 is turned on, the data signal supplied from the data line Dj is transferred to the first transistor T1.

The third transistor T3 is connected between the drain electrode of the first transistor T1 and the first node N1. In some embodiments, the gate electrode of the third transistor T3 is connected to the scan line Si. The third transistor T3 is turned on when a scan signal of the gate-on voltage (e.g., a low level voltage) is supplied from the scan line Si, to electrically connect the drain electrode of the first transistor T1 with the first node N1. Accordingly, when the third transistor T3 is turned on, the first transistor T1 is diode-connected.

The fourth transistor T4 is connected between the first node N1 and the reference voltage VINT. In some embodiments, the gate electrode of the fourth transistor T4 is connected to the previous scan line, e.g., the $(i-1)^{th}$ scan line Si−1. The fourth transistor T4 is turned on when a scan signal of the gate-on value (e.g., a low level voltage) is supplied to the $(i-1)^{th}$ scan line S(i−1), to transfer the voltage of the initialization voltage Vint to the first node N1. The reference voltage VINT may have a voltage equal to or less than the minimum voltage of the data signal.

The fifth transistor T5 is connected between the first power supply voltage VDD and the source electrode of the first transistor T1. In some embodiments, the gate electrode of the fifth transistor T5 is connected to the emission control line, e.g., the $i^{th}$ emission control line Ei. The fifth transistor T5 is turned off when an emission control signal of a gate-off voltage (e.g., a high level voltage) is supplied to the emission control line Ei, and is turned on when an emission control signal of a gate-on voltage (e.g., a low level voltage) is supplied to the emission control line Ei.

The sixth transistor T6 is connected between the drain electrode of the first transistor T1 and one end of each of the light-emitting diodes LD. In some embodiments, the gate electrode of the sixth transistor T6 is connected to the emission control line, e.g., the $i^{th}$ emission control line Ei. The sixth transistor T6 is turned off when an emission control signal of a gate-off voltage (e.g., a high level voltage) is supplied to the emission control line Ei, and is turned on when an emission control signal of a gate-on voltage (e.g., a low level voltage) is supplied to the emission control line Ei.

The seventh transistor T7 is connected between one end of each of the light-emitting diodes LD (e.g., a second node N2) and the reference voltage VINT. Further, the gate electrode of the seventh transistor T7 is connected to one of the scan lines of the subsequent stage, for example, the $(i+1)^{th}$ scan line Si+1 (or the $i^{th}$ sensing control line SLi). The seventh transistor T7 is turned on when a scan signal of the gate-on voltage (e.g., a low level voltage) is supplied to the (i+1)th scan line S(i+1) (or the $i^{th}$ sensing control line SLi), to supply the reference voltage VINT to one end of each of the light-emitting diodes LD.

The storage capacitor Cst is connected between the first power supply voltage VDD and the first node N1. The storage capacitor Cst stores a charge or voltage corresponding to a data signal supplied to the first node N1 and a voltage corresponding to the threshold voltage of the first transistor T1 in each frame.

Although the transistors included in the pixel circuit PXC, e.g., the first to seventh transistors T1 to T7 are all p-type transistors in the example shown in FIG. 21, the present disclosure is not limited thereto. For example, at least one of the first to seventh transistors T1 to T7 may be altered to n-type transistors.

Referring back to FIG. 21, during the process of aligning the light-emitting diodes LD in the pixel PXL, the first pixel electrode ELT1 and the second pixel electrode ELT2 of the emission unit EMU may be connected to the first line AL1 and the second line AL2. The AC voltage V_AC may be applied to the first line AL1, e.g., the second power supply voltage VSS connected to the first line AL1, and the ground voltage GND may be applied to the second line AL2, e.g., the second node N2 connected to the second line AL2. In some embodiments, the ground voltage GND may be applied to the reference voltage line L_VINT (or sensing line SSL) connected to the first line AL1, and the seventh transistor T7 is turned on, so that the ground voltage GND applied to the second node N2 can be supplemented or enhanced.

When voltages of different levels are applied to the first line AL1 and the second line AL2, an electric field is formed between the first pixel electrode ELT1 and the second pixel electrode ELT2, so that the light-emitting diodes LD can be aligned between the two pixel electrodes.

As described above with reference to FIGS. 19-21, the display devices 100_5 and 100_6 include the reference voltage line L_VINT connected to the first line AL1, and the ground voltage GND is applied to the first pixel electrode ELT1 (or the second node N2 of the pixel PXL_1 of FIG. 21)

through the first line AL1 and the reference voltage line L_VINT. In this manner, the light-emitting diodes LD can be aligned more efficiently.

Figure 22:
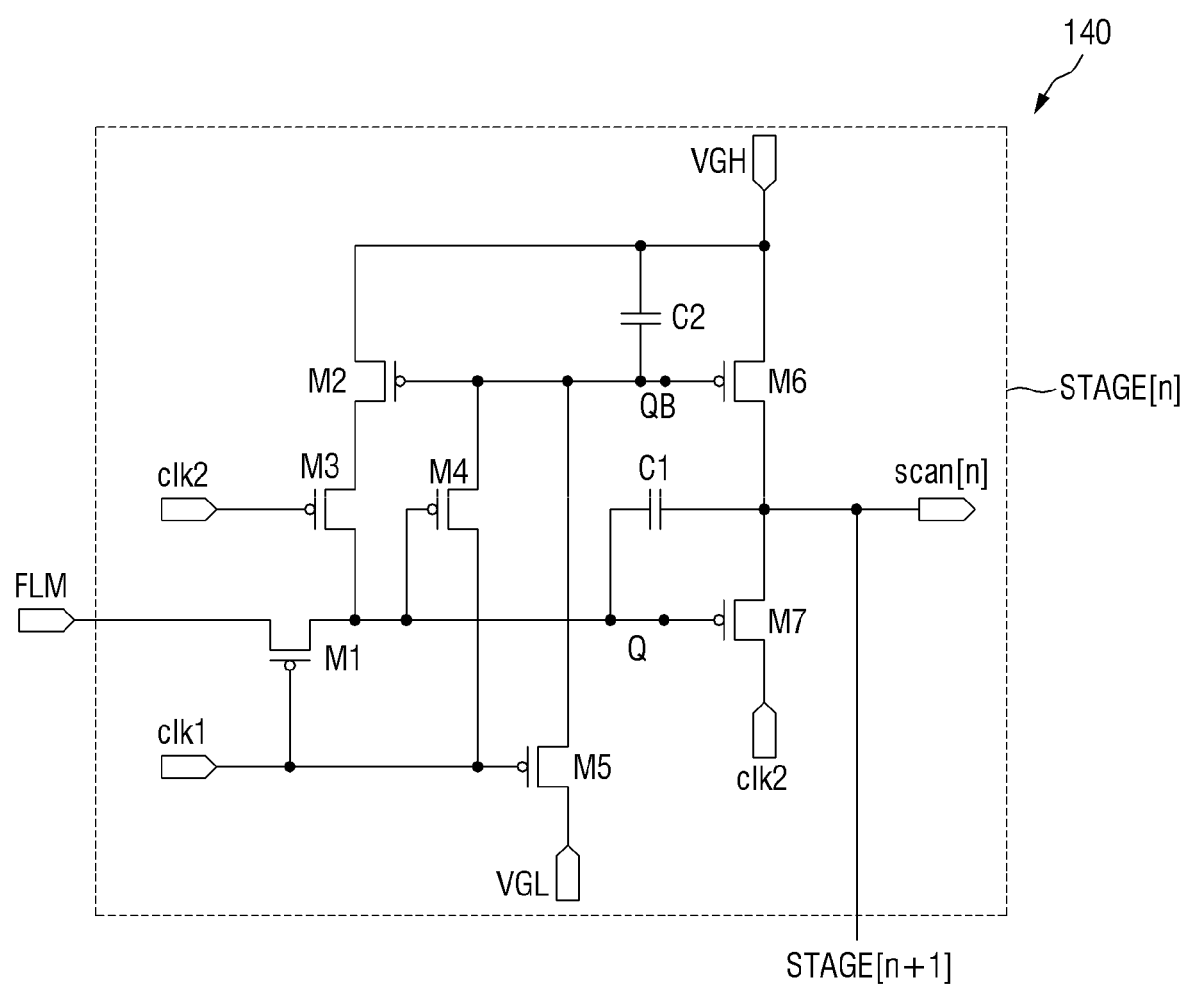
FIG. 22 is a circuit diagram showing an example of the scan driver included in the display device of FIG. 19.

FIG. 22 is a circuit diagram showing an example of the scan driver included in the display device of FIG. 19.

Referring to FIGS. 20 and 22, the scan driver 140 may include a plurality of stages STATE[n] respectively connected to a plurality of pixel rows.

The $n^{th}$ stage STAGE[n] may include first to seventh thin-film transistors M1 to M7 and first and second capacitors C1 and C2.

The first thin-film transistor M1 may include a first electrode receiving a start signal FLM, a second electrode connected to a first control node Q, and a gate electrode receiving a first clock signal clk1. The start signal FLM may indicate the start of scanning. The first clock signal clk1 may be a square wave having a logic high level and a logic low level for a certain period of time (e.g., one reference horizontal hour 1 H). A second clock signal clk2 to be described later may have an inverted waveform of the first clock signal clk1. A high-level voltage VGH and a low-level voltage VGL may be power supply voltages required to drive the stage STAGE[n] (or the scan driver 140). The high-level voltage VGH may have a higher potential than the low-level voltage VGL.

The second thin-film transistor M2 includes a first electrode connected to the high-level voltage VGH, a second electrode electrically connected to the first control node Q via the third thin-film transistor M3, and a gate electrode connected to a second control node QB.

The third thin-film transistor M3 includes a first electrode connected to the second electrode of the second thin-film transistor M2, a second electrode connected to the first control node Q, and a gate electrode receiving the second clock signal clk2.

The fourth thin-film transistor M4 includes a first electrode connected to the second control node QB, a second electrode receiving the first clock signal clk1, and a gate electrode connected to the first control node Q.

The fifth thin-film transistor M5 includes a first electrode connected to the second control node QB, a second electrode receiving the low-level voltage VGL, and a gate electrode receiving the first clock signal clk1.

The sixth thin-film transistor M6 includes a first electrode for receiving the high-level voltage VGH, a second electrode connected to an output terminal, and a gate electrode connected to the second control node QB.

The seventh thin-film transistor M7 includes a first electrode connected to the second clock signal clk2, a second electrode connected to the output terminal, and a gate electrode connected to the first control node Q.

The first capacitor C1 may be connected between the output terminal and the first control node Q to boost the output voltage of the output terminal based on the voltage at the first control node Q. The second capacitor C2 may be connected between the second control node QB and the high-level voltage VGH.

The $n^{th}$ stage STAGE[n] may output a signal scan[n] at the turn-on voltage level (e.g., a logic low level) through the first thin-film transistor M1, the seventh thin-film transistor M7, and the first capacitor C1, and may output a signal at the turn-off voltage level (e.g., a logic high level) using the second to sixth thin-film transistors M2 to M6 and the second capacitor C2.

In the process of aligning the light-emitting diodes LD, each of the high-level voltage VGH and the start signal FLM may have a first voltage level (or the turn-on voltage level, e.g., −5 V), and the low-level voltage VGL may have a second voltage level (e.g., −7.5V) having a magnitude greater than the first voltage level. Because the low-level voltage VGL is greater than the high-level voltage VGH by the threshold voltage Vth of the thin-film transistor or more, the sixth thin-film transistor M6 may be turned on.

Each of the first and second clock signals clk1 and clk2 may have a second voltage level, e.g., −10V. In this instance, the fifth thin-film transistor M5 may be turned on, and an output signal having the same voltage level as that of the high-level voltage VGH (i.e., the first voltage level) is output from the $n^{th}$ stage STAGE[n].

As described above with reference to FIG. 22, in the process of aligning the light-emitting diodes LD, the scan driver 140 can output the control signal having the turn-on voltage level to the sensing line SSL when the start signal FLM, the high-level voltage VGH, the low-level voltage VGL, and the first and second clock signals clk1 and clk2 applied to the scan driver 140 are set to the voltages. Accordingly, the ground voltage GND (or alignment voltage) applied through the reference voltage line L_VINT may be provided to the first pixel electrode ELT1 through some transistors in the pixel PXL. The light-emitting diodes LD may be aligned even without additional first alignment line, and thus no additional process for removing the first alignment line or forming the first pixel electrode ELT1 independently is required. As a result, the process of fabricating the display device 100 can be simplified.

Figure 23:
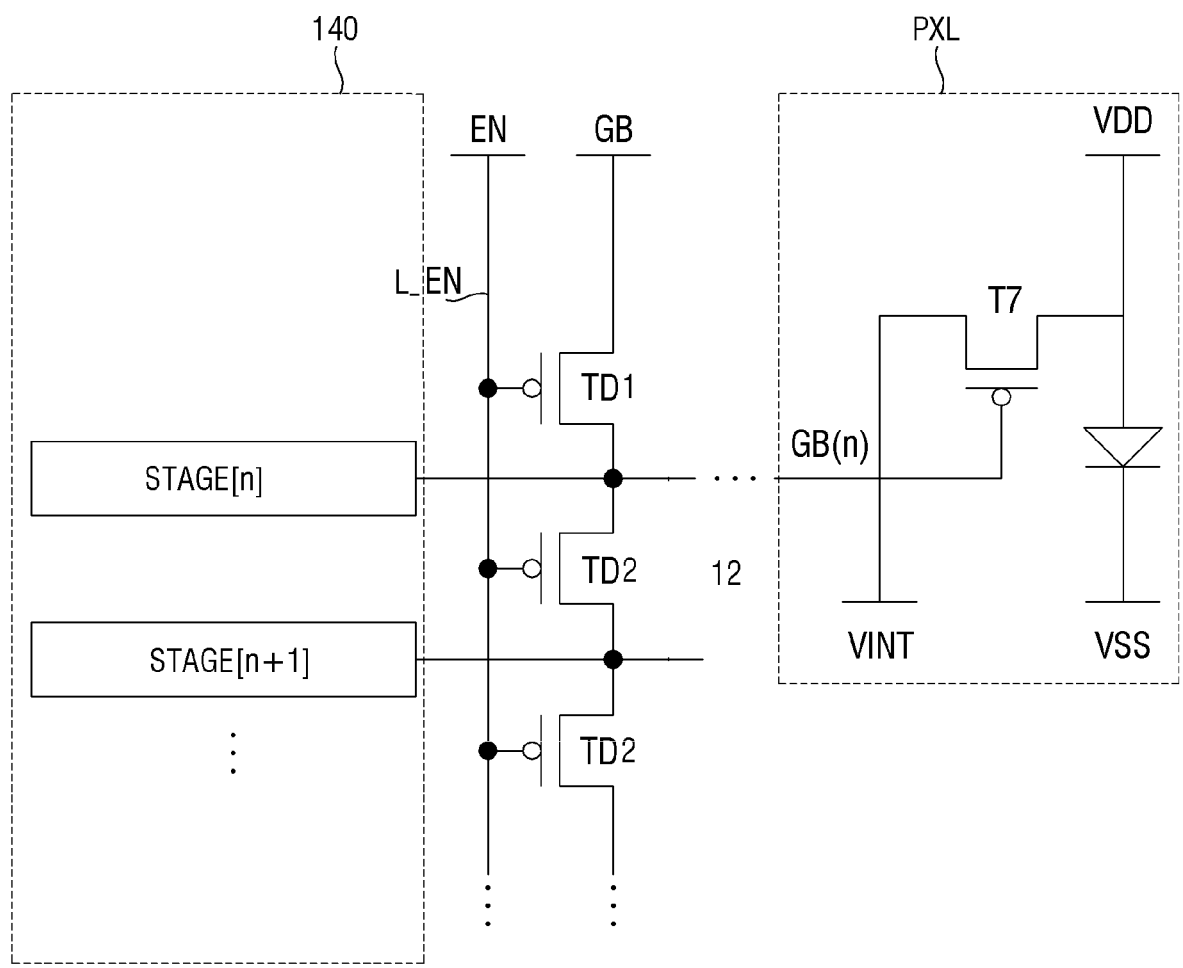
FIG. 23 is a circuit diagram showing another example of the display device shown in FIG. 19.

FIG. 23 is a circuit diagram showing another example of the display device shown in FIG. 19. FIG. 23 schematically shows a part of each of the display panel 110 and the scan driver 140 included in the display device of FIG. 20.

Referring to FIG. 23, the display device 100 may further include at least one of first and second dummy transistors TD1 and TD2 disposed between the scan driver 140 and the sensing line SSL and a dummy control line L_EN.

The first dummy transistor TD1 may include a first electrode receiving a sensing control signal GB, a second electrode connected to the sensing line SSL, and a gate electrode connected to the dummy control line L_EN. The first dummy transistor TD1 may be turned on in response to a dummy control signal EN at the turn-on voltage level (e.g., a logic low level) and may provide a sensing control signal GB at the turn-on voltage level to the pixel PXL. In such a case, the seventh transistor T7 (or a transistor connected between the first pixel electrode and the reference voltage) of the pixel PXL may be turned on.

The second dummy transistor TD2 may include a first electrode connected to the previous sensing line, a second electrode connected to the sensing line SSL, and a gate electrode connected to the dummy control line L_EN. Similar to the first dummy transistor TD1, the second dummy transistor TD2 may be turned on in response to the dummy control signal EN at the turn-on voltage level (e.g., the logic low level), and may provide a sensing control signal GB at the turn-on voltage level to the pixel PXL. In such a case, the seventh transistor T7 (or a transistor connected between the first pixel electrode and the reference voltage) of the pixel PXL may be turned on.

As such, during the process of aligning the light-emitting diodes LD, the ground voltage GND may be applied to the first pixel electrode from the reference voltage line L_VINT through the dummy control line L_EN and the dummy transistors TD1 and TD2.

As described above with reference to FIG. 23, during the process of aligning the light-emitting diodes LD, by using the dummy transistors TD1 and TD2 disposed between the scan driver 140 and the sensing line SSL, the sensing transistor (e.g., the seventh transistor T7) of the pixel PXL may be turned on, and the ground voltage GND (i.e., an alignment voltage) may be applied to the first pixel electrode from the reference voltage line L_SEN (or L_VINT). In such a case, the stress of the scan driver 140 described with reference to FIG. 30 (i.e., the stress on the transistor circuit in the scan driver 140 due to DC driving of the scan driver 140) can be reduced.

Figure 24:
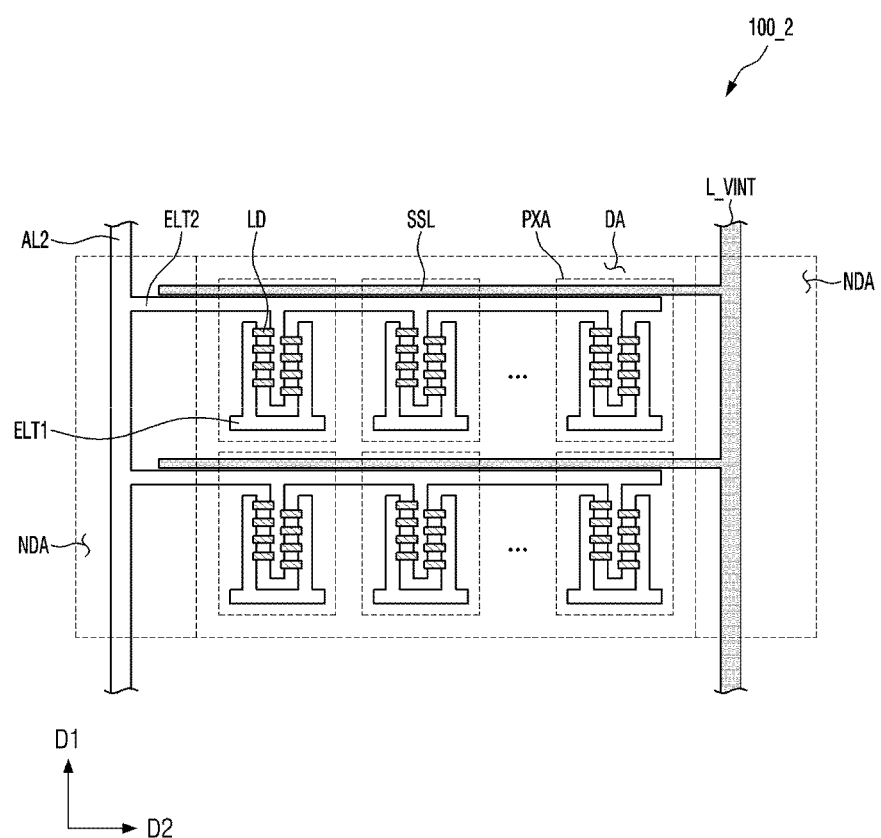
FIGS. 24-26 are plan views showing other examples of the display device of FIG. 2.
Figure 25:
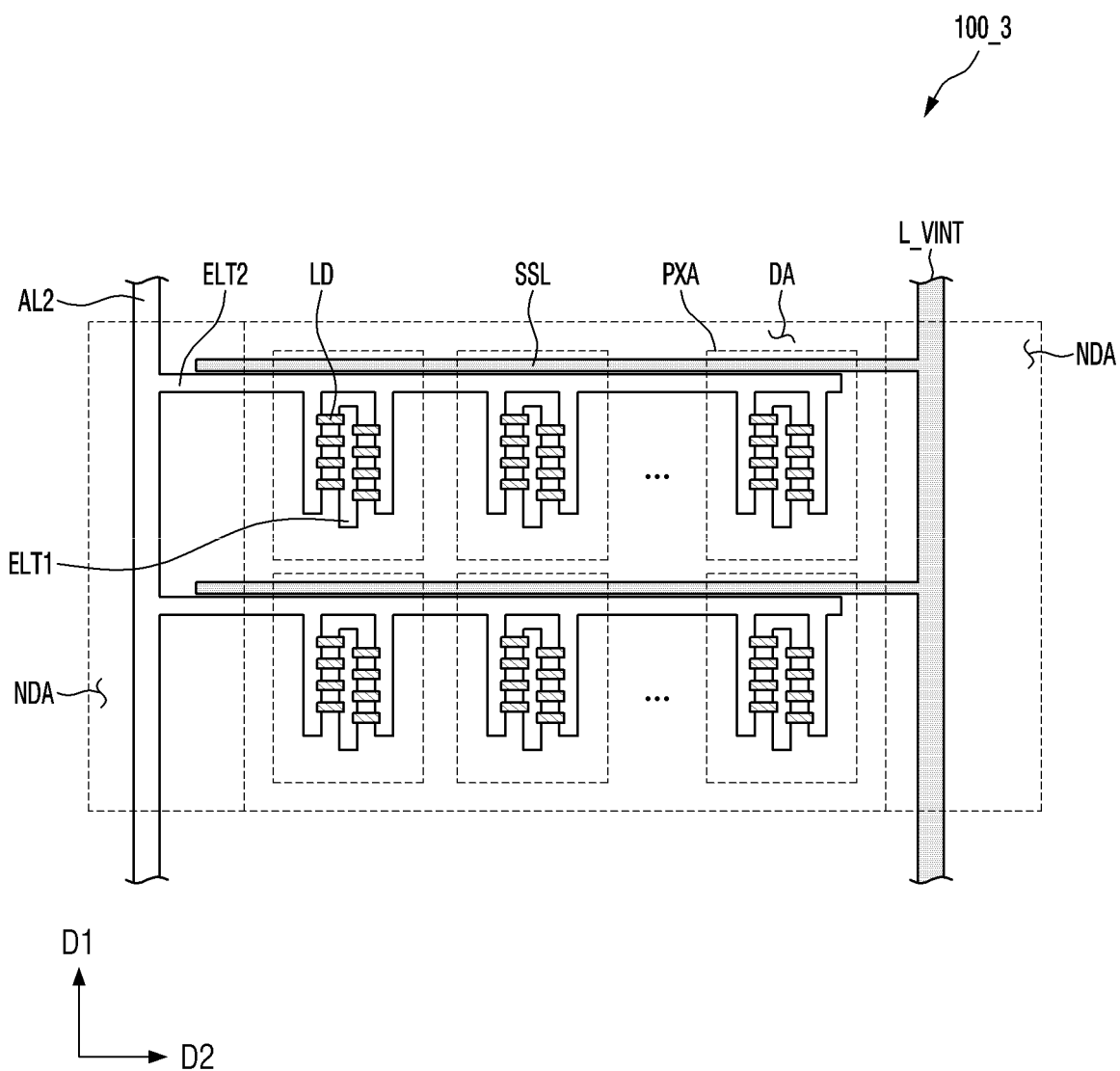
Figure 26:
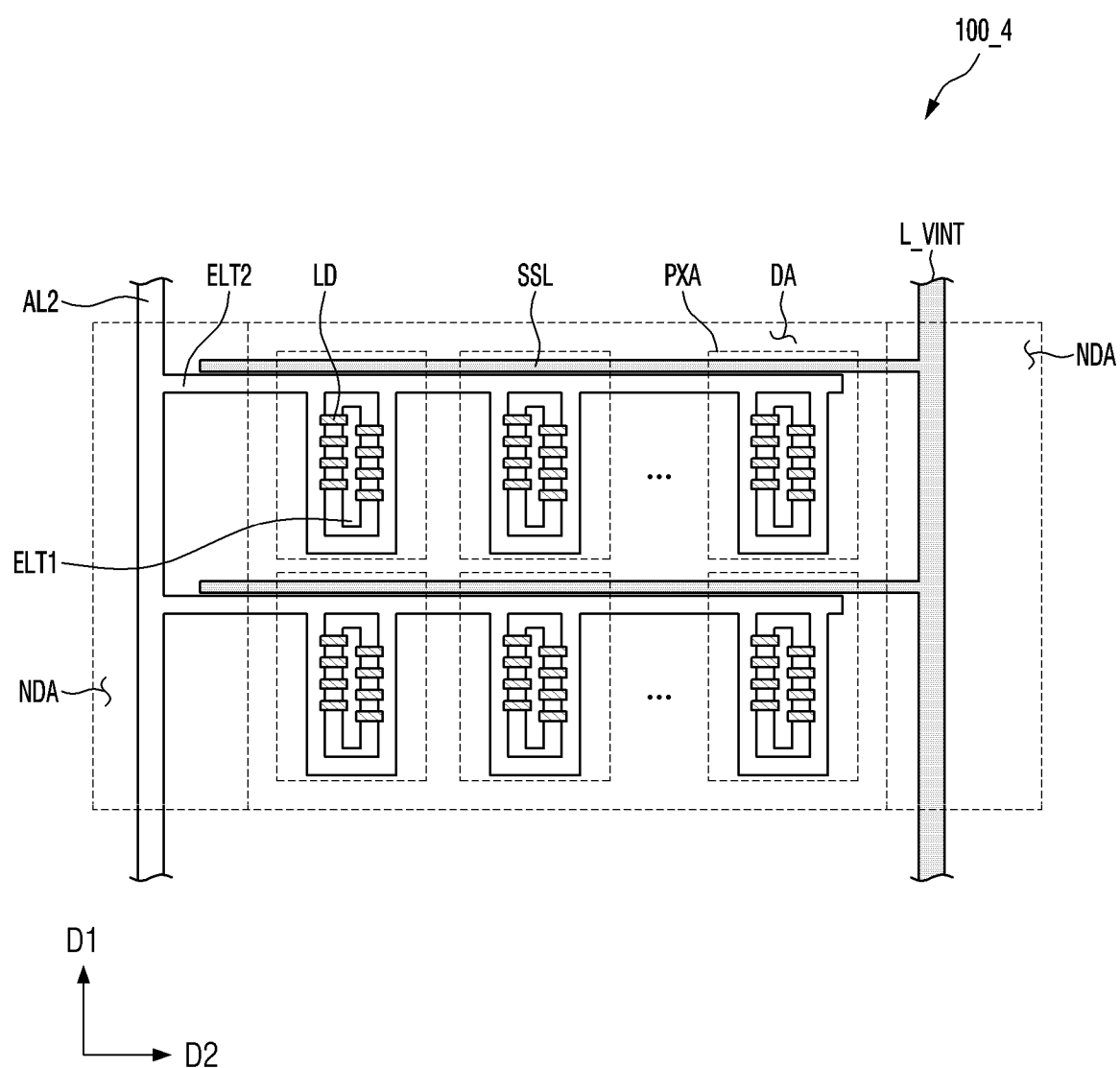

FIGS. 24-26 are plan views showing other examples of the display device of FIG. 2.

A display device 100_2 of FIG. 24 is substantially identical to the display device 100 of FIG. 2 except for first pixel electrodes ELT1; and, therefore, the redundant descriptions will be omitted.

The first pixel electrode ELT1 shown in FIG. 24 may be formed via the same process as the second pixel electrode ELT2 and the second line AL2.

Each of the first pixel electrodes ELT1 may include a connection portion disposed to face the body portion of the second pixel electrode ELT2 (i.e., a portion extended in the second direction D2 to reach other pixel areas PXA), and branch portions disposed to face branches of the second pixel electrode ELT2 (i.e., a portion extended from the body portion in the first direction D1).

The connection portion of the first pixel electrode ELT1 is extended outward from the outer side of the branch portions of the second pixel electrode ELT2, and the shape of the first pixel electrode ELT1 have a "⊥" character (or an inverse "Π" character) when viewed from the top. In other words, the first pixel electrode ELT1 may include stubs protruding from the connection portion of the first pixel electrode ELT1 in the second direction D2.

Referring to FIG. 25, a display device 100_3 may include first pixel electrodes ELT1, which do not include the connection portion described above with reference to FIG. 24 but include only branch portions disposed to face the branch portions of the second pixel electrode ELT2.

The branch portions of the first pixel electrodes ELT1 may be electrically connected to the reference voltage line L_VINT (or the sensing line SSL) through a contact hole, a connection line pattern, etc.

Referring to FIG. 26, a display device 100_4 may include first pixel electrodes ELT1 and second pixel electrodes ELT2. The first pixel electrodes ELT1 may be extended in the first direction D1 and may be formed independently of other electrodes, like the branch portions of the first pixel electrodes ELT1 described above with reference to FIG. 25. The second pixel electrodes ELT2 may be disposed to surround the first pixel electrodes ELT1, respectively. As each of the second pixel electrodes ELT2 forms a closed loop in the pixel area PXA, the resistance decreases, and accordingly, a drop in the voltage applied through the second pixel electrode ELT2 (e.g., an alternating voltage as an alignment voltage) can be reduced.

Although the second pixel electrode ELT2 has a rectangular shape in the drawings, this is merely illustrative. The second pixel electrode ELT2 may have a shape such as a circle and a polygon, e.g., a pentagon, a hexagon, etc. when viewed from the top.

As described above with reference to FIGS. 24-26, the first pixel electrodes ELT1 may be connected to the reference voltage line L_VINT, and thus no additional process, e.g., an etching process of separating them from other pixel electrodes, is required after they has been formed together with the second pixel electrodes ELT2. Accordingly, the shape of the first pixel electrode ELT1 is not limited herein, and the pixel PXL surrounded by the second pixel electrodes ELT2 may be applied.

FIGS. 27-34 are diagrams showing pixels included in the display device of FIG. 1 according to various embodiments of the present disclosure.

Figure 27:
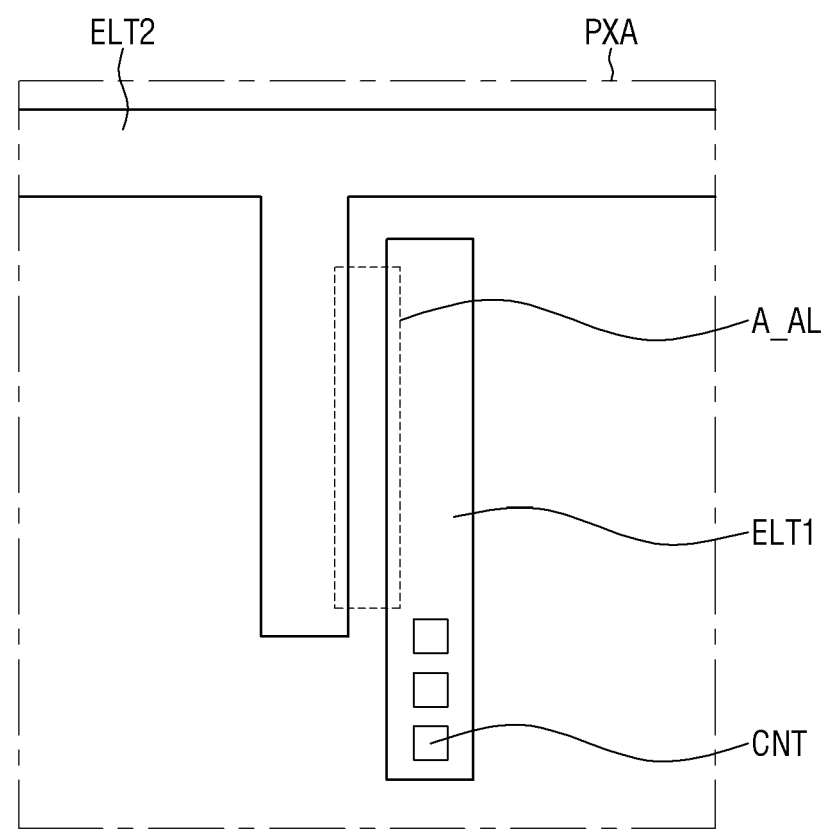
FIGS. 27-34 are diagrams showing pixels included in the display device of FIG. 1 according to various embodiments of the present disclosure.

Referring to FIGS. 1 and 27, the second pixel electrode ELT2 includes a body portion extended in the second direction D2 (or stem, stem electrode), and a branch portion (or a protrusion or a protrusion electrode) extended from the body portion in the first direction D1 in the pixel area PXA. The body portion may be extended to other pixel areas PXA.

The first pixel electrode ELT1 may be disposed to face the branch portion of the second pixel electrode ELT2 and may be extended in the first direction D1. The first pixel electrode ELT1 may protrude in the first direction DR1 more than the second pixel electrode ELT2. In such case, an alignment area A_AL (i.e., an area where the light-emitting diodes LD are disposed) may be defined between the first pixel electrode ELT1 and the branch portion of the second pixel electrode ELT2.

Contact holes CNT through which the first pixel electrode ELT1 is connected to a transistor may be formed in the protruding portion of the first pixel electrode ELT1, i.e., the portion that does not overlap the alignment area A_AL. The transistor may be, for example, the first transistor T1 described above with reference to FIG. 12, which may be a transistor disposed in the circuit element layer PCL described above with reference to FIG. 4.

Figure 28:
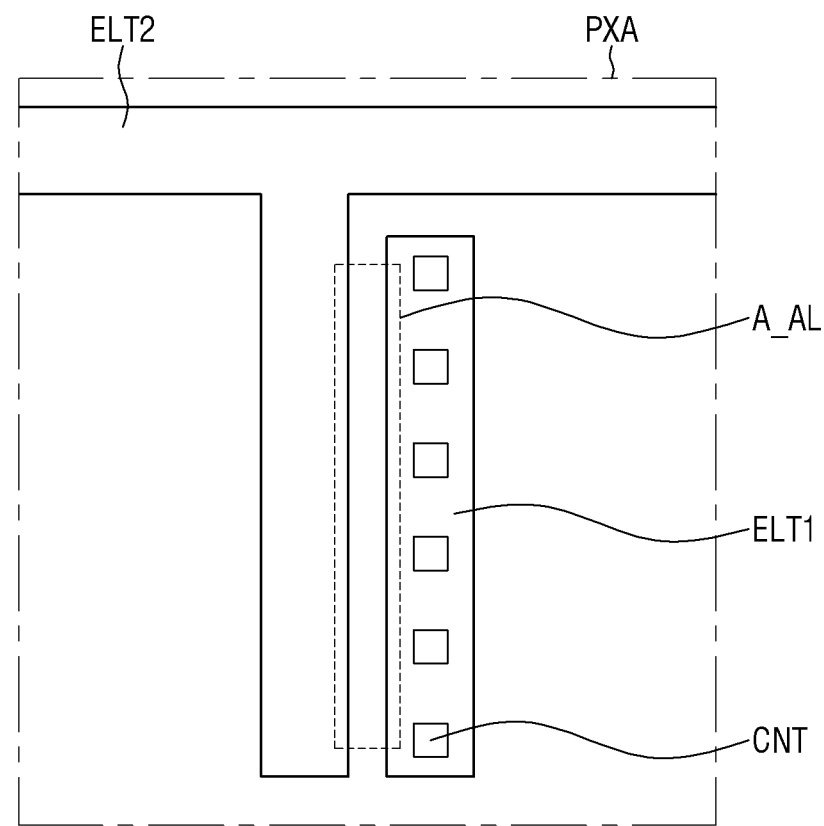
Figure 28:
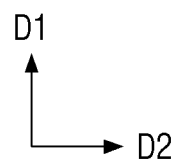

Referring to FIG. 28, the first pixel electrode ELT1 and the second pixel electrode ELT2 may be substantially identical to the first pixel electrode ELT1 and the second pixel electrode ELT2 described above with reference to FIG. 27, respectively; and, therefore, the redundant descriptions will be omitted.

The first pixel electrode ELT1 may be disposed to face the branch portion of the second pixel electrode ELT2 in the pixel area PXA, and one end, e.g., the lower end of the first pixel electrode ELT1 in the first direction D1 may be aligned with one end, e.g., lower end of the branch portion of the second pixel electrode ELT2 in the first direction D1. In other words, the first pixel electrode ELT1 may not protrude from the branch portion of the second pixel electrode ELT2 in the first direction D1. In such a case, the alignment area A_AL may overlap the entire side of the first pixel electrode ELT1, i.e., the side facing the branch portion of the second pixel electrode ELT2. In some embodiments, the contact holes CNT may be distributed throughout the first pixel electrode ELT1.

Figure 29:
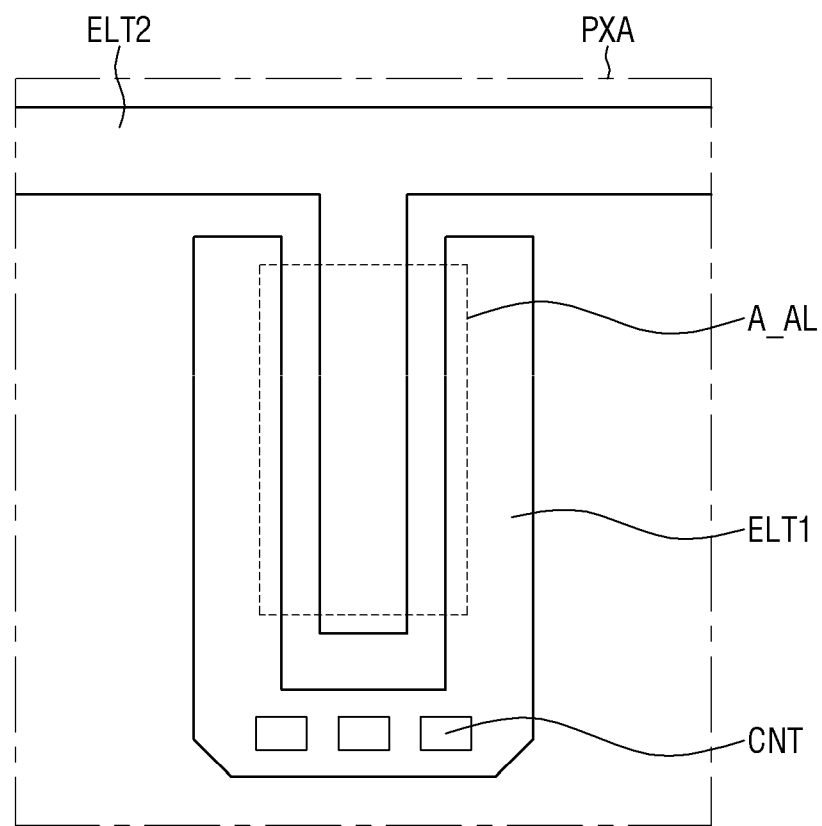

Referring to FIG. 29, the second pixel electrode ELT2 may be substantially identical to the second pixel electrode ELT2 described above with reference to FIG. 27; and, therefore, the redundant descriptions will be omitted.

The first pixel electrode ELT1 may be disposed to face all sides of the branch portion of the second pixel electrode ELT2.

As shown in FIG. 29, three sides of the branch portion of the second pixel electrode ELT2 may be exposed except for the side in contact with the body portion. In such a case, the first pixel electrode ELT1 may include a first branch portion disposed to face one longer side of the branch portion of the second pixel electrode ELT2 and extended in the first direction D1, a connection portion extended from one end of the first branch portion in the second direction D2 and disposed to face one shorter side of the branch portion of the second pixel electrode ELT2, and a second branch portion extended from one end of the connection portion in the first direction D1 and disposed to face the other longer side of the branch portion of the second pixel electrode ELT2. In other words, the first pixel electrode ELT1 has a ⊔ shape or a U shape when viewed from the top, and may be disposed to surround the branch portion of the second pixel electrode ELT2. Corners where the first and second branch portions of the first pixel electrode ELT1 meet the connection portion have an obtuse angle or have an edge-treated shape (e.g., a rounded edge shape), and do not include a stub.

The arrangement area A_AL may overlap the longer sides of the branch portion of the second pixel electrode ELT2 and the first and second branch portions of the first pixel electrode ELT1. Contact holes CNT may be formed in a second portion (or the connection portion) of the first pixel electrode ELT1 and may not overlap with the alignment area A_AL.

Figure 30:
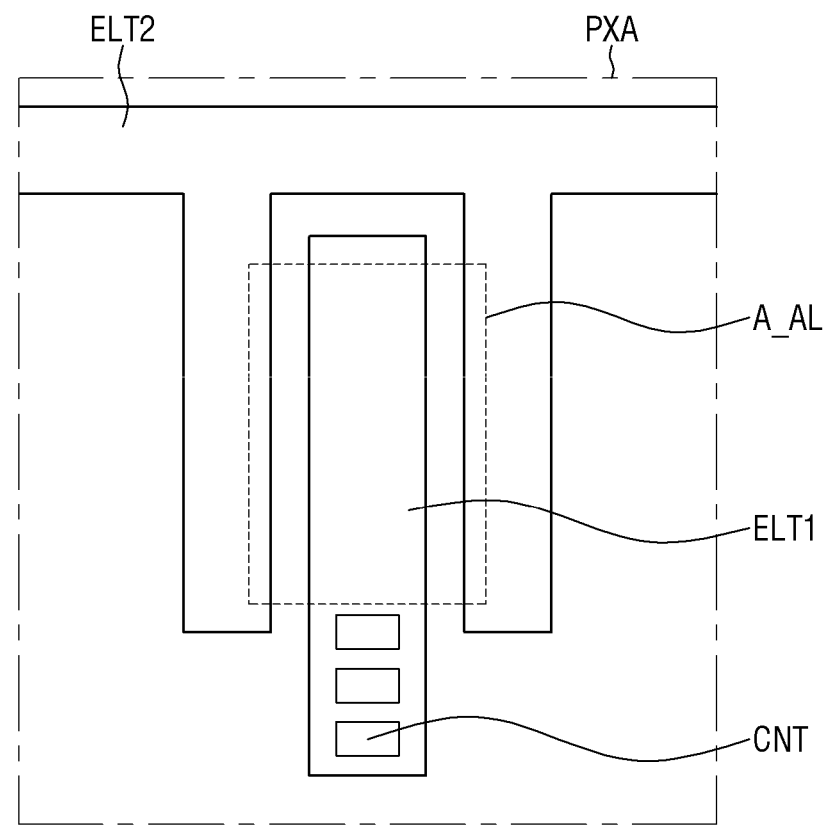

A first pixel electrode ELT1 and a second pixel electrode ELT2 of FIG. 30 are substantially identical to the first pixel electrode ELT1 and the second pixel electrode ELT2 described above with reference to FIG. 27, respectively, except that the second pixel electrode ELT2 includes two branch portions; and, therefore, the redundant descriptions will be omitted.

The branch portions of the second pixel electrode ELT2 may be disposed to face both longer sides of the first pixel electrode ELT1, respectively. In such a case, the alignment area A_AL may be formed between the branch portions of the second pixel electrode ELT2 or may overlap them. Contact holes CNT may be formed at one end of the first pixel electrode ELT1 that does not overlap with the alignment area A_AL.

Figure 31:
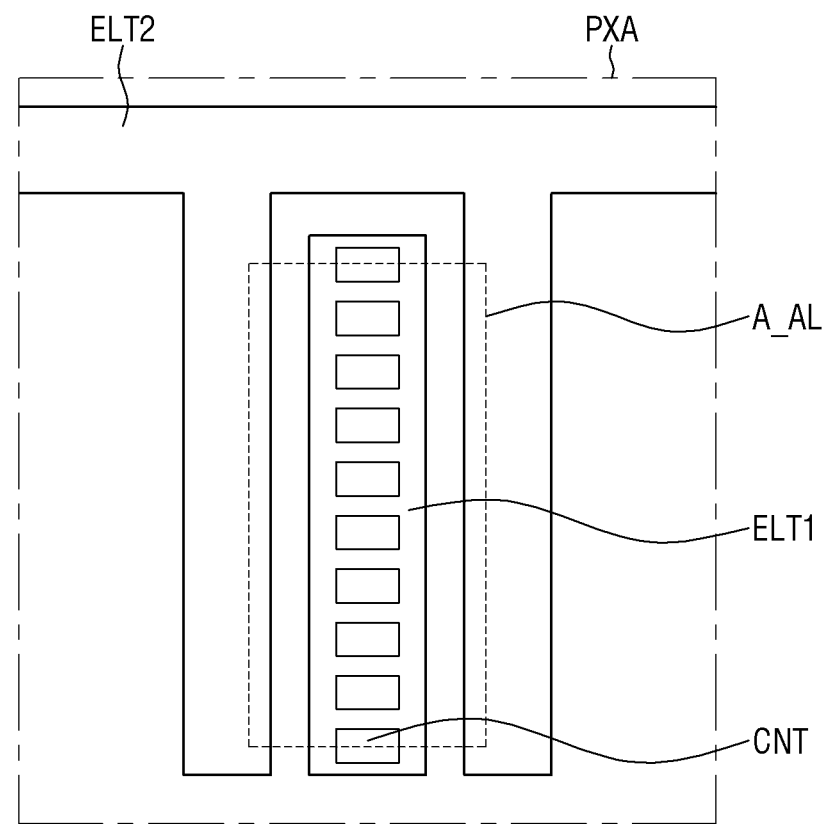

A first pixel electrode ELT1 and a second pixel electrode ELT2 of FIG. 31 are substantially identical to the first pixel electrode ELT1 and the second pixel electrode ELT2 described above with reference to FIG. 28, respectively, except that the second pixel electrode ELT2 includes two branch portions; and, therefore, the redundant descriptions will be omitted.

The branch portions of the second pixel electrode ELT2 may be disposed to face both longer sides of the first pixel electrode ELT1, respectively. The alignment area A_AL may be formed between the branch portions of the second pixel electrode ELT2 and may overlap the first pixel electrode ELT1. The contact holes CNT may be distributed throughout the first pixel electrode ELT1.

Figure 32:
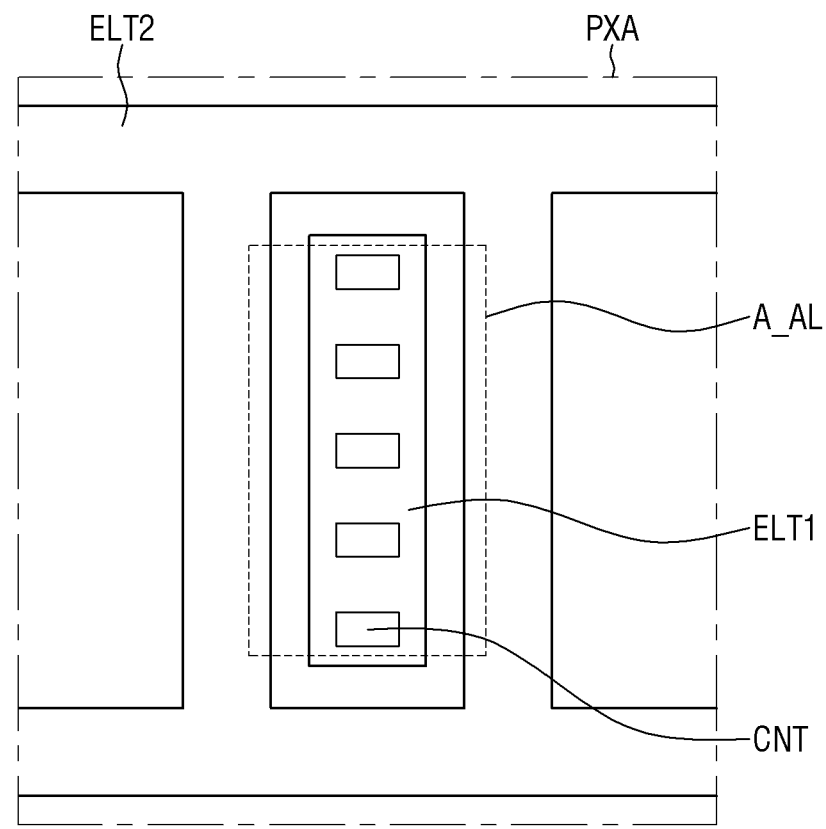

A first pixel electrode ELT1 and a second pixel electrode ELT2 of FIG. 32 are substantially identical to the first pixel electrode ELT1 and the second pixel electrode ELT2 described above with reference to FIG. 26, respectively, except that the second pixel electrode ELT2 includes two body portions; and, therefore, the redundant descriptions will be omitted.

The second pixel electrode ELT2 may surround the first pixel electrode ELT1. The first pixel electrode ELT1 may have an island structure due to the second pixel electrode ELT2 when viewed from the top. The second pixel electrode ELT2 may include two body portions facing each other and extended in the second direction D2, and two branch portions extended in the first direction D1 between the body portions and connecting the body portions with each other. In such a case, the first pixel electrode ELT1 may be disposed in an inner space formed by the body portions and branch portions when viewed from the top. The two body portions of the second pixel electrode ELT2 may be extended to other pixel areas PXA in the second direction D2. In such a case, the resistance of the second pixel electrode ELT2 can be reduced by the two body portions, and a drop in the voltage (e.g., alignment voltage, power supply voltage, etc.) applied to the second pixel electrode ELT2 can be reduced.

The alignment area A_AL may be formed between the branch portions of the second pixel electrode ELT2 and may overlap the first pixel electrode ELT1. In this case, the contact holes CNT may be distributed throughout the first pixel electrode ELT1.

Figure 33:
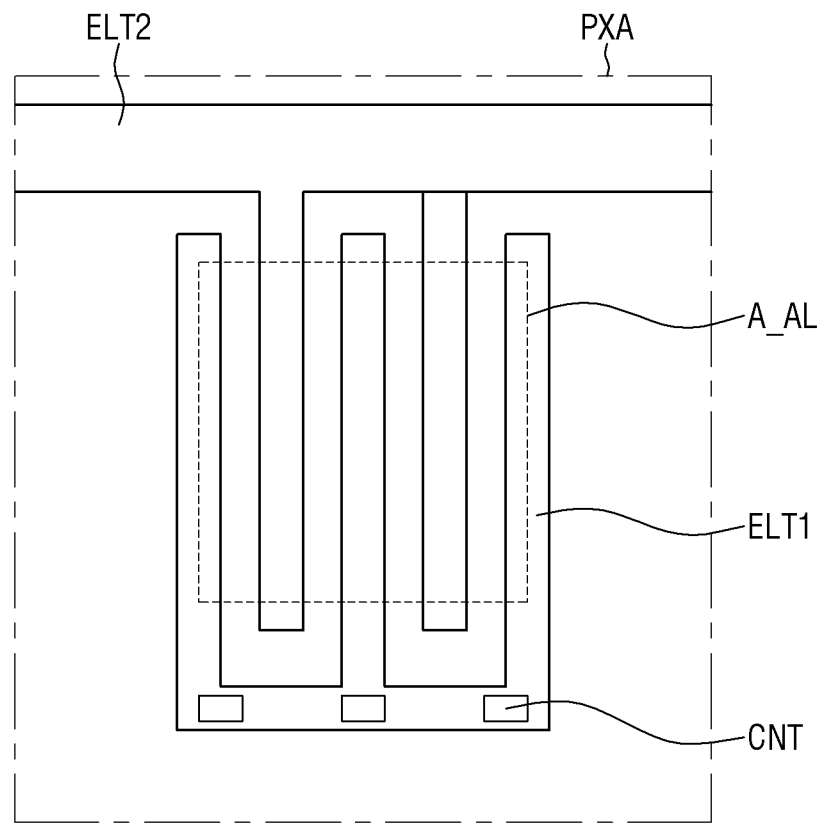
Figure 33:
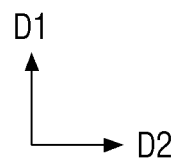

Referring to FIG. 33, a second pixel electrode ELT2 may include two branch portions, and a first pixel electrode ELT1 may include three branch portions. Except for this, the first pixel electrode ELT1 and the second pixel electrode ELT2 may be substantially identical to the first pixel electrode ELT1 and the second pixel electrode ELT2 described above with reference to FIG. 29, respectively; and, therefore, the redundant descriptions will be omitted.

The second pixel electrode ELT2 may include a body portion extended in the second direction D2, and two branch portions extended from the body portion in the first direction D1 and spaced from each other. The first pixel electrode ELT1 may include three branch portions disposed to face the longer sides of the second pixel electrode ELT2 and a connection portion connecting the three branch portions. As shown in FIG. 33, the second pixel electrode ELT2 may have generally a "π" or Π shape when viewed from the top (e.g., in a plan view), and the first pixel electrode ELT1 may have a shape of a trident facing the second pixel electrode ELT2.

Figure 34:
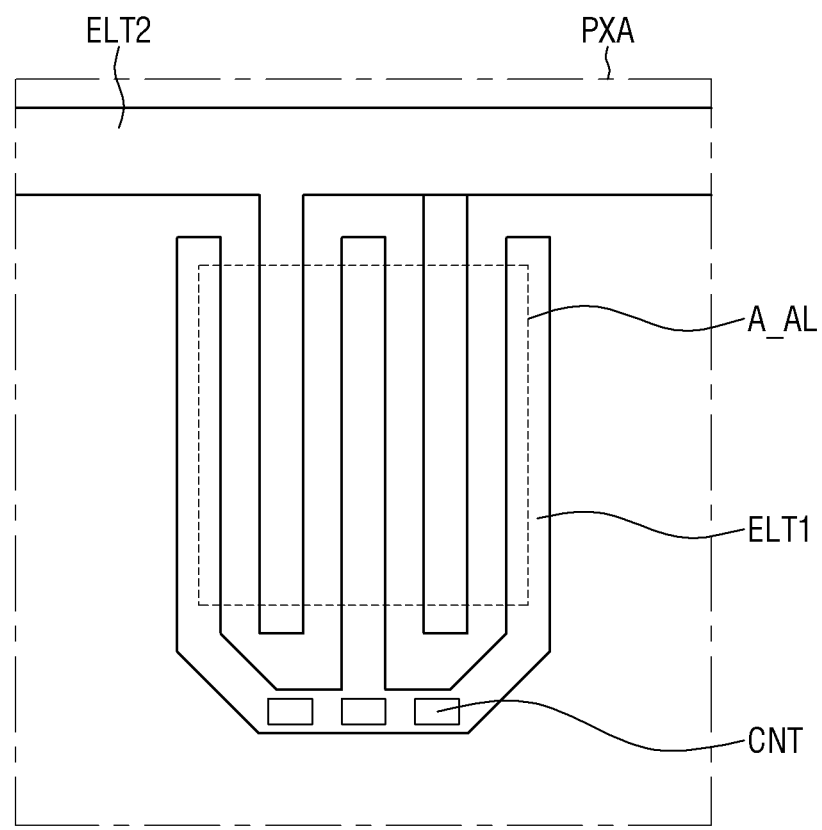

Although each of the branch portions and the connection portion of the first pixel electrode ELT1 forms a right angle in FIG. 33, the present disclosure is not limited thereto. For example, as shown in FIG. 34, each of the branch portions and the connection portion of the first pixel electrode ELT1 may form an obtuse angle or have an edge-treated shape, and may include no stub.

As described above with reference to FIGS. 27-34, the pixel PXL may include the first and second pixel electrodes ELT1 and ELT2 having various shapes as long as the second pixel electrode ELT2 does not include a stub.

Figure 35:
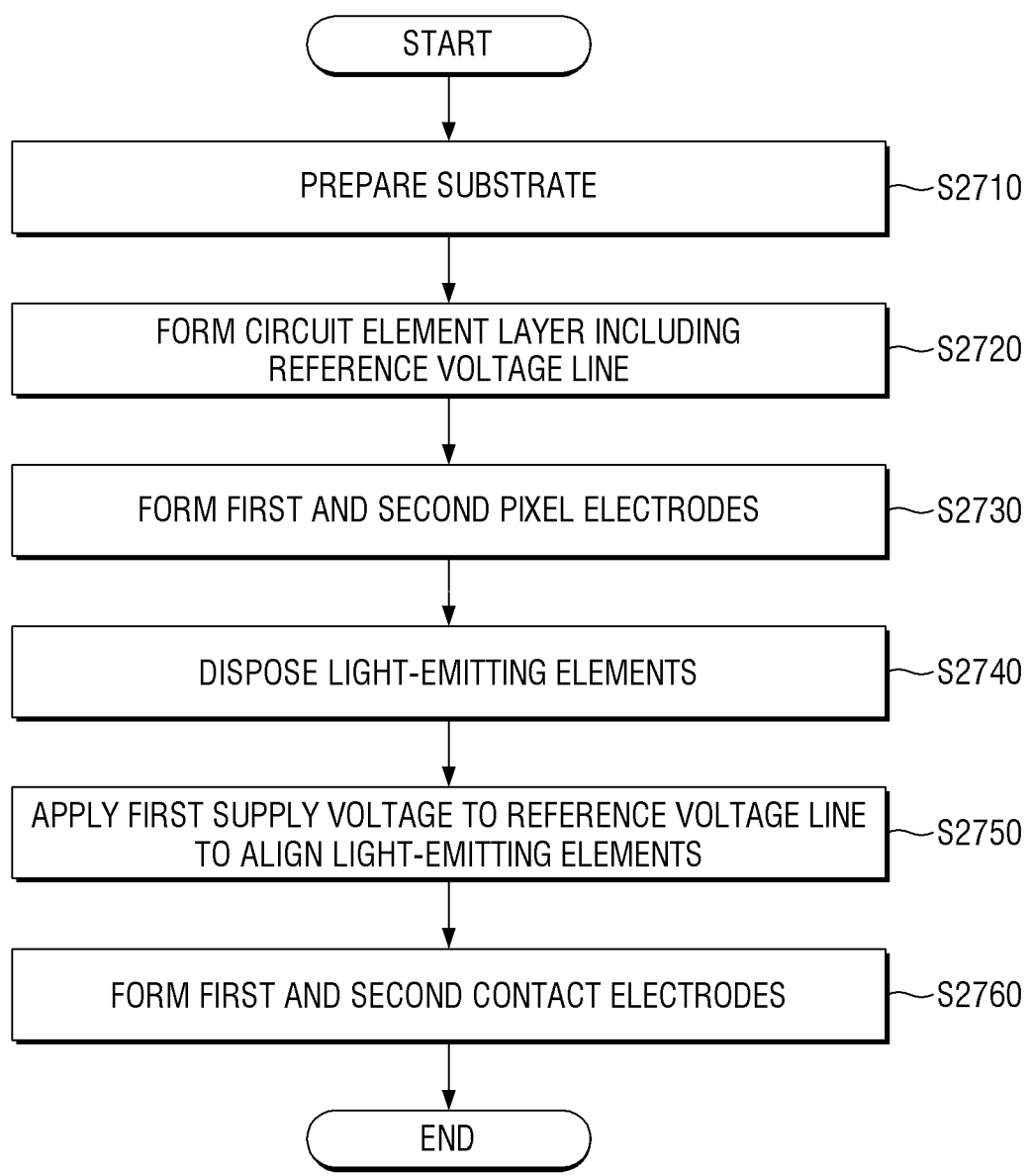
FIG. 35 is a flowchart for illustrating a method for fabricating the display devices according to the embodiments of the present disclosure.

FIG. 35 is a flowchart for illustrating a method for fabricating the display devices according to the embodiments of the present disclosure.

Referring to FIGS. 1, 2, and 35, the display device of FIG. 1 can be fabricated by the method of FIG. 35.

The method of FIG. 35 starts with preparing a substrate SUB for fabricating a display device 100 (e.g., S2710).

The substrate SUB may be a base for individually fabricating the display device 100. It is, however, to be understood that the present disclosure is not limited thereto. For example, the substrate SUB may be a base of a mother glass for concurrently fabricating (or simultaneously fabricating) the display devices 100.

On the substrate SUB, a display area DA and a non-display area NDA may be defined. The display area DA may include a plurality of pixel areas PXA, and the non-display area NDA may be disposed outside the display area DA.

Once the substrate SUB is prepared, the method of FIG. 35 may include forming a circuit element layer PCL on the substrate SUB in the display area DA (e.g., S2720). The circuit element layer PCL may include a reference voltage line L_SEN.

As described above with reference to FIG. 2, the reference voltage line L_SEN may be formed in the non-display area NDA and may be connected to the sensing line SSL. The reference voltage line L_SEN may be made up of a single layer or multiple layers. When the reference voltage line L_SEN includes at least one sub-line SUL, the sub-line SUL may be formed at the same layer during the same process as at least one electrode formed on the circuit element layer PCL. According to the method of FIG. 35, at least one electrode may be formed in the circuit element layer PCL, and, at the same time, at least one sub-line, e.g., at least one of the first to fourth sub-lines SUL1 to SUL4 described above with Referring to FIGS. 7-10 may be formed at the same layer as the at least one electrode.

First and second pixel electrodes ELT1 and ELT2 may be formed on the substrate SUB in the display area DA (e.g., S2730). In some embodiments, first and second lines AL1 and AL2 may be formed on the substrate SUB in the non-display area NDA.

The first and second lines AL1 and AL2 may be connected to the first pixel electrode ELT1 and the second pixel electrode ELT2, respectively. The first alignment line AL1 may be electrically connected to the reference voltage line L_VINT through the first contact hole CNT1.

Subsequently, the method of FIG. 35 may include supplying or disposing the light-emitting diodes LD on the substrate SUB where the first and second pixel electrodes ELT1 and ELT2 and the first and second lines AL1 and AL2 are formed (e.g., S2740).

For example, the method of FIG. 35 may include supplying the light-emitting diodes LD on the pixel areas PXA of the display area DA using various techniques including inkjet printing.

Subsequently, the method of FIG. 35 may include applying a first power supply voltage (or an alignment voltage, for example, a ground voltage GND) to the reference voltage line L_VINT to align the light-emitting diodes LD (e.g., S2750).

For example, according to the method of FIG. 35, the voltage is applied to the reference voltage line L_SEN and the second line AL2 concurrently (or simultaneously) with or after the supply of the light-emitting diodes LD, and thus the light-emitting diodes LD can be aligned between the first and second pixel electrodes ELT1 and ELT2 connected to the reference voltage line L_VINT and the second line AL2.

Subsequently, the method of FIG. 35 may include forming the first and second contact electrodes CNE1 and CNE2 on the substrate SUB on which the light-emitting diodes LD are aligned (e.g., S2760).

As described above with reference to FIG. 7, the first contact electrode CNE1 may connect a first end EP1 of at least one of the light-emitting diodes LD with the first pixel electrode ELT1 disposed in the pixel area PXA. In some embodiments, the second contact electrode CNE2 may connect a second end EP2 of at least one of the light-emitting diodes LD with the second pixel electrode ELT2 disposed in the pixel area PXA.

Although the embodiments of the present disclosure have been described with reference to the accompanying drawings, those skilled in the art would understand that various modifications and alterations may be made without departing from the technical idea or essential features of the present disclosure. Therefore, it should be understood that the above-mentioned embodiments are not limiting but illustrative in all aspects. Accordingly, the present disclosure is not limited to such embodiments, but rather to the broader scope of the appended claims and various obvious modifications and equivalent arrangements as would be apparent to a person of ordinary skill in the art.

What is claimed is:

1. A method of fabricating a display device comprising a substrate, the substrate comprising a display area and a non-display area located outside the display area, the display area comprising a plurality of pixel areas, the method comprising:
    forming a first switching element in each of the pixel areas, and forming a circuit element layer in the non-display area, the circuit element layer comprising a reference voltage line electrically connected to the first switching element;
    forming pixel electrodes on the circuit element layer in the pixel areas, the pixel electrodes comprising a first pixel electrode and a second pixel electrode, the first pixel electrode being electrically connected to the reference voltage line through the first switching element and the second pixel electrode opposite the first pixel electrode;
    arranging a plurality of light-emitting elements between the first pixel electrode and the second pixel electrode; and
    aligning the light-emitting elements between the first pixel electrode and the second pixel electrode by applying a first power supply voltage to the reference voltage line and applying a second power supply voltage to the second pixel electrode.

2. The method of claim 1, further comprising:
    forming first contact electrodes on first ends of the light-emitting elements to connect the light-emitting elements with the first pixel electrode; and
    forming second contact electrodes on second ends of the light-emitting elements to connect the light-emitting elements with the second pixel electrode.

3. The method of claim 2, wherein no etching process is carried out between the aligning the light-emitting elements and the forming the first contact electrodes.

4. The method of claim 1, wherein the aligning the light-emitting elements comprises:
    applying a first control signal for turning on the first switching element to a control electrode of the first switching element.

5. The method of claim 4, wherein the circuit element layer further comprises a second switching element connected between the first pixel electrode and a first voltage terminal, and a third switching element connected between a control electrode of the second switching element and a data line.

6. The method of claim 5, wherein the aligning the light-emitting elements further comprises:
    turning on each of the second switching element and the third switching element,
    wherein a turn-on voltage for turning on the second switching element is applied to the data line, and
    wherein the first power supply voltage is applied to the first voltage terminal.

7. The method of claim 5, wherein the circuit element layer further comprises a capacitor connected between the first pixel electrode and the control electrode of the second switching element.

8. The method of claim 7, wherein the aligning the light-emitting elements further comprises turning on the third switching element, and wherein the first power supply voltage is applied to the data line.

9. The method of claim 1, wherein the forming the pixel electrodes further comprises:
    forming a first line connected to the reference voltage line in the non-display area, and a connection electrode connecting the first line with the first pixel electrode.

10. The method of claim 9, wherein the first power supply voltage is applied to the reference voltage line through the first line.

11. The method of claim 9, further comprising:
removing the connection electrode to separate the first line from the first pixel electrode.

12. The method of claim 1, wherein the circuit element layer further comprises a first insulating layer, a second insulating layer, a third insulating layer, and a fourth insulating layer sequentially stacked on one another between the substrate and a display element layer.

13. The method of claim 12, wherein the reference voltage line comprises at least one of: a first sub-line between the third insulating layer and the fourth insulating layer; a second sub-line between the second insulating layer and the third insulating layer; a third sub-line between the first insulating layer and the second insulating layer; and a fourth sub-line between the substrate and the first insulating layer.

14. The method of claim 1, wherein a first voltage line comprises a first sub-voltage line on the circuit element layer and directly connected to the reference voltage line, and a second sub-voltage line on the first sub-voltage line, and wherein a conductivity of the second sub-voltage line is greater than that of the first sub-voltage line.

15. The method of claim 1, wherein the forming the circuit element layer comprises:
forming a scan signal line connected to a control electrode of the first switching element, and a first dummy switching element connecting the scan signal line with a dummy line in the non-display area.

16. The method of claim 15, wherein the aligning the light-emitting elements comprises:
applying a turn-on voltage for turning on the first switching element to the dummy line; and turning on the first dummy switching element.

17. The method of claim 15, wherein the circuit element layer further comprises a second dummy switching element connecting the scan signal line with an adjacent scan signal line, and
wherein the aligning the light-emitting elements further comprises turning on the second dummy switching element.

18. A display device comprising:
a substrate comprising a display area and a non-display area located outside the display area, the display area comprising a plurality of pixel areas;
a circuit element layer comprising a first switching element in each of the pixel areas, a reference voltage line in the non-display area and electrically connected to the first switching element, and a scan line connected to a control electrode of the first switching element; and
a display element layer comprising a first pixel electrode on the circuit element layer in each of the pixel areas and electrically connected to the reference voltage line through the first switching element, a second pixel electrode facing the first pixel electrode, and a plurality of light-emitting elements arranged between the first pixel electrode and the second pixel electrode,
wherein the circuit element layer further comprises a dummy line in the non-display area, and a first dummy switching element connected between the dummy line and the scan line.

19. The display device of claim 18, wherein the circuit element layer further comprises a second dummy switching element connecting the scan line with an adjacent scan line.

20. A display device comprising:
a substrate comprising a display area and a non-display area located outside the display area, the display area comprising a plurality of pixel areas;
a circuit element layer comprising a circuit element in each of the pixel areas, and a reference voltage line in the non-display area and electrically connected to the circuit element; and
a display element layer comprising a first pixel electrode on the circuit element layer in each of the pixel areas, a second pixel electrode opposite the first pixel electrode, and a plurality of light-emitting elements arranged between the first pixel electrode and the second pixel electrode,
wherein the second pixel electrode is around the first pixel electrode, and
wherein the first pixel electrode is electrically connected to the reference voltage line in the non-display area through a switching element of the circuit element.

* * * * *